(12) United States Patent
Zhang et al.

(10) Patent No.: US 9,206,078 B2
(45) Date of Patent: Dec. 8, 2015

(54) BARRIER LAYERS FOR SILVER REFLECTIVE COATINGS AND HPC WORKFLOWS FOR RAPID SCREENING OF MATERIALS FOR SUCH BARRIER LAYERS

(71) Applicant: Intermolecular Inc., San Jose, CA (US)

(72) Inventors: Guizhen Zhang, Santa Clara, CA (US); Jeremy Cheng, Cupertino, CA (US); Guowen Ding, San Jose, CA (US); Minh Huu Le, San Jose, CA (US); Daniel Schweigert, Fremont, CA (US); Yu Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 174 days.

(21) Appl. No.: 13/801,635

(22) Filed: Mar. 13, 2013

(65) Prior Publication Data

US 2014/0272454 A1    Sep. 18, 2014

(51) Int. Cl.
| | | |
|---|---|---|
| *B32B 15/04* | (2006.01) | |
| *B32B 17/06* | (2006.01) | |
| *C03C 17/36* | (2006.01) | |
| *C23C 14/14* | (2006.01) | |
| *C23C 14/00* | (2006.01) | |
| *C23C 14/04* | (2006.01) | |

(52) U.S. Cl.
CPC ......... *C03C 17/3681* (2013.01); *C03C 17/3605* (2013.01); *C03C 17/366* (2013.01); *C03C 17/3618* (2013.01); *C03C 17/3644* (2013.01); *C23C 14/0036* (2013.01); *C23C 14/042* (2013.01); *C23C 14/14* (2013.01)

(58) Field of Classification Search
CPC ........ C03C 17/00; C03C 17/06; C03C 17/22; C03C 17/23; C03C 17/34; C03C 17/3411; C03C 17/36; C03C 17/3602; C03C 17/3607; C03C 17/3615; C03C 17/3618; C03C 17/3644; C03C 17/3652; C03C 17/3613; C03C 17/3681; C03C 17/366; C03C 17/3604; C03C 17/361; C03C 17/3639; C03C 17/3642; C03C 17/3657; B32B 9/00; B32B 15/00; B32B 15/04; B32B 17/00; B32B 17/06; B32B 2255/06; B32B 2255/205; B32B 2255/28; B32B 2255/00
USPC ......... 428/426, 428, 432, 433, 434, 688, 689, 428/697, 699, 701, 702
See application file for complete search history.

(56) References Cited

U.S. PATENT DOCUMENTS 5,413,864 A * 5/1995 Miyazaki et al. ............. 428/432
5,591,529 A * 1/1997 Braatz et al. .................. 428/457

(Continued)

*Primary Examiner* — David Sample
*Assistant Examiner* — Lauren Colgan

(57) ABSTRACT

Provided is High Productivity Combinatorial (HPC) testing methodology of semiconductor substrates, each including multiple site isolated regions. The site isolated regions are used for testing different compositions and/or structures of barrier layers disposed over silver reflectors. The tested barrier layers may include all or at least two of nickel, chromium, titanium, and aluminum. In some embodiments, the barrier layers include oxygen. This combination allows using relative thin barrier layers (e.g., 5-30 Angstroms thick) that have high transparency yet provide sufficient protection to the silver reflector. The amount of nickel in a barrier layer may be 5-10% by weight, chromium—25-30%, titanium and aluminum—30%-35% each. The barrier layer may be co-sputtered in a reactive or inert-environment using one or more targets that include all four metals. An article may include multiple silver reflectors, each having its own barrier layer.

17 Claims, 15 Drawing Sheets

(56) References Cited

U.S. PATENT DOCUMENTS

| | | | |
|---|---|---|---|
| 5,821,001 A * | 10/1998 | Arbab et al. | 428/623 |
| 6,020,077 A * | 2/2000 | Schicht et al. | 428/622 |
| 7,745,009 B2 * | 6/2010 | Decroupet et al. | 428/432 |
| 2003/0043464 A1 * | 3/2003 | Dannenberg | 359/585 |
| 2003/0194488 A1 | 10/2003 | Stachowiak | |
| 2003/0228476 A1 * | 12/2003 | Buhay et al. | 428/469 |
| 2004/0126591 A1 * | 7/2004 | Schicht et al. | 428/434 |
| 2006/0024589 A1 | 2/2006 | Schwarzl | |
| 2007/0081228 A1 * | 4/2007 | Hartig | 359/359 |
| 2007/0116965 A1 * | 5/2007 | Medwick et al. | 428/426 |
| 2007/0206263 A1 * | 9/2007 | Neuman et al. | 359/267 |
| 2008/0187692 A1 * | 8/2008 | Roquiny et al. | 428/34 |
| 2008/0220261 A1 * | 9/2008 | List et al. | 428/428 |
| 2008/0311389 A1 * | 12/2008 | Roquiny et al. | 428/336 |
| 2009/0004412 A1 * | 1/2009 | Decroupet et al. | 428/34 |
| 2009/0176086 A1 * | 7/2009 | Martin et al. | 428/332 |
| 2009/0214880 A1 * | 8/2009 | Lemmer | 428/432 |
| 2009/0263596 A1 * | 10/2009 | Lao et al. | 428/34 |
| 2009/0324934 A1 | 12/2009 | Blacker | |
| 2010/0075155 A1 * | 3/2010 | Veerasamy | 428/428 |
| 2010/0279144 A1 * | 11/2010 | Frank et al. | 428/623 |
| 2010/0295330 A1 * | 11/2010 | Ferreira et al. | 296/84.1 |
| 2010/0297413 A1 * | 11/2010 | Hartig | 428/213 |
| 2011/0261442 A1 * | 10/2011 | Knoll et al. | 359/360 |
| 2012/0070652 A1 * | 3/2012 | Krasnov et al. | 428/336 |
| 2012/0070672 A1 * | 3/2012 | Imran et al. | 428/432 |
| 2012/0087185 A1 * | 4/2012 | Zhou et al. | 365/171 |
| 2012/0107587 A1 * | 5/2012 | Martin et al. | 428/216 |
| 2012/0127578 A1 * | 5/2012 | Bright et al. | 359/585 |
| 2012/0219821 A1 * | 8/2012 | Frank et al. | 428/630 |
| 2012/0225224 A1 * | 9/2012 | Blacker et al. | 428/34 |
| 2012/0225304 A1 * | 9/2012 | Imran et al. | 428/433 |
| 2012/0225316 A1 * | 9/2012 | Imran et al. | 428/623 |
| 2012/0225317 A1 * | 9/2012 | Imran et al. | 428/630 |
| 2012/0308811 A1 * | 12/2012 | Roquiny et al. | 428/336 |
| 2013/0029121 A1 * | 1/2013 | Hartig | 428/213 |
| 2013/0117992 A1 * | 5/2013 | Imran et al. | 29/428 |
| 2013/0118673 A1 * | 5/2013 | Frank et al. | 156/145 |
| 2013/0118674 A1 * | 5/2013 | Imran et al. | 156/182 |
| 2013/0164464 A1 * | 6/2013 | Lage et al. | 428/34 |
| 2013/0216860 A1 * | 8/2013 | Imran et al. | 428/623 |
| 2013/0216861 A1 * | 8/2013 | Imran et al. | 428/630 |
| 2013/0251923 A1 * | 9/2013 | Lao et al. | 428/34 |
| 2013/0320241 A1 * | 12/2013 | Krasnov et al. | 250/492.1 |
| 2013/0323442 A1 * | 12/2013 | Krasnov | 428/34 |
| 2014/0017510 A1 * | 1/2014 | Frank et al. | 428/623 |
| 2014/0141259 A1 * | 5/2014 | Imran et al. | 428/428 |
| 2014/0141261 A1 * | 5/2014 | Imran et al. | 428/432 |
| 2014/0147681 A1 * | 5/2014 | Imran et al. | 428/428 |
| 2014/0154524 A1 * | 6/2014 | Imran et al. | 428/623 |
| 2014/0177042 A1 * | 6/2014 | Hassan et al. | 359/360 |
| 2014/0178578 A1 * | 6/2014 | Zhang et al. | 427/162 |
| 2014/0186636 A1 * | 7/2014 | Imran et al. | 428/428 |
| 2014/0268301 A1 * | 9/2014 | Ding et al. | 359/296 |
| 2014/0268316 A1 * | 9/2014 | Zhang et al. | 359/359 |
| 2014/0272335 A1 * | 9/2014 | Hassan et al. | 428/203 |
| 2014/0272353 A1 * | 9/2014 | Ding et al. | 428/216 |
| 2014/0272354 A1 * | 9/2014 | Ding et al. | 428/216 |
| 2014/0272395 A1 * | 9/2014 | Ding et al. | 428/336 |
| 2014/0272454 A1 * | 9/2014 | Zhang et al. | 428/623 |

* cited by examiner

BARRIER LAYERS FOR SILVER REFLECTIVE COATINGS AND HPC WORKFLOWS FOR RAPID SCREENING OF MATERIALS FOR SUCH BARRIER LAYERS

TECHNICAL FIELD

The present disclosure relates generally to the use of high productivity combinatorial (HPC) techniques for the development of rapid screening of materials for barrier layers used to protect silver reflective coatings as well as compositions and structures of the barrier layers and articles including these layers. High Productivity Combinatorial™ and HPC™ are trademarks of Intermolecular, Inc.

BACKGROUND

Metallic silver has many different applications because of its high electrical conductivity and reflectivity of infrared light. For example, metallic silver layers are frequently used in low emissivity (low-E) glass coatings. The thermal efficiency of window glass may be significantly improved by applying one or more silver reflective layers that do not let some of radiant infrared energy pass through the glass. As such, the radiant heat is kept on the same side of the glass from which it originated, while letting visible light pass. This effect results in more efficient windows because radiant heat originating from indoors in winter is reflected back inside preserving the heat where it is needed. On the other hand, the infrared heat generated by the sun during summer is reflected away, keeping the inside of the building cooler.

SUMMARY

Provided is High Productivity Combinatorial (HPC) testing methodology of semiconductor substrates, each including multiple site isolated regions. The site isolated regions are used for testing different compositions and/or structures of barrier layers disposed over silver reflectors. The tested barrier layers may include all or at least two of nickel, chromium, titanium, and aluminum. In some embodiments, the barrier layers include oxygen. This combination allows using relative thin barrier layers (e.g., 5-30 Angstroms thick) that have high transparency yet provide sufficient protection to the silver reflector. The amount of nickel in a barrier layer may be 5-10% by weight, chromium—25-30%, titanium and aluminum—30%-35% each. The barrier layer may be co-sputtered in a reactive or inert-environment using one or more targets that include all four metals. An article may include multiple silver reflectors, each having its own barrier layer.

In some embodiments, a method for high productivity combinatorial testing of semiconductor substrates involves providing a substrate include a reflective layer. The substrate includes multiple site-isolated regions defined thereon, each including a portion of the reflective layer. The substrate may be a glass sheet or any other suitable substrate. The reflective layer includes metallic silver. In some embodiments, the reflective layer may be formed from silver. The thickness of the reflective layer may be between 50 Angstroms and 200 Angstroms. The method may proceed with forming a barrier layer over the reflective layer in each one of the multiple site-isolated regions. The composition and/or thickness of the barrier layer is varied in a combinatorial manner between each of the site-isolated regions. The barrier layer in each of the site isolated regions may include at least two of nickel, chromium, titanium, and aluminum. In some embodiments, some site isolated regions include all four of these metals. In some embodiments, the barrier layer also includes oxygen. The barrier layer is configured to protect metallic silver in the reflective layer from oxidation during processing and operation of the article. Specifically, the barrier layer is configured to protect metallic silver during deposition of additional layers over a stack including the reflective layer and the barrier layer, in particular during deposition of additional layers containing oxygen, such as metal oxides. Metallic silver easily oxidizes, which causes degradation of various characteristics of the reflective layer, such as conductivity, transparency, reflectivity, and the like.

In some embodiments, a combined concentration of nickel and chromium in the barrier layer is between 20% by weight and 50% by weight or, more specifically, between 30% by weight and 40% by weight. The rest may be titanium and aluminum. In some embodiments, the barrier layer does not include any components other than nickel, chromium, titanium, and aluminum. A weight ratio of nickel to chromium may be between 3 and 5 or, more specifically, about 4. A weight ratio of titanium to aluminum is between 0.5 and 2 or, more specifically, about 1. In some embodiments, nickel, chromium, titanium, and aluminum are uniformly distributed throughout the barrier layer. Other distributions of these four metals are possible as well. For example, one or more of these metals may have higher concentration at the interface with the reflective layer than in other parts of the barrier layer.

In some embodiments, the barrier layer has a thickness of between 1 Angstroms and 100 Angstroms on average or, more specifically, between 5 Angstroms and 30 Angstroms or even between 10 Angstroms and 20 Angstroms. The barrier layer may be deposited using physical vapor deposition (PVD). Other deposition techniques may be used as well. In some embodiments, the barrier layer is deposited using co-sputtering of nickel, chromium, titanium, and aluminum.

In some embodiments, the method also involved depositing a seed layer between the substrate and the reflective layer. The seed layer may directly interface the reflective layer. The seed layer may include one of $ZnO$, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, or $MoO_3$ in a crystalline phase. In some embodiments, the method also involves depositing a dielectric layer between the seed layer and the substrate or disposed over the barrier layer. The dielectric layer may include one of $TiO_2$, $SnO_2$, or $ZnSn$ in an amorphous phase. The dielectric layer may include a dopant, such as Al, Ga, In, Mg, Ca, Sr, Sb, Bi, Ti, V, Y, Zr, Nb, Hf, Ta, or combinations thereof. The compositions and/or thicknesses of the dielectric and/or seed layer may be varied in a combinatorial manner in some embodiments.

Provided are articles including silver reflectors for low emission glass, light emitting diode, optical reflector, and other like applications. In some embodiments, the article includes a substrate, a reflective layer disposed over the substrate, and a barrier layer disposed over the reflective layer. The substrate may be a glass sheet or any other suitable substrate. The reflective layer includes metallic silver. The barrier layer comprising nickel, chromium, titanium, and aluminum. In some embodiments, the barrier layer also includes oxygen. The barrier layer is configured to protect metallic silver in the reflective layer from oxidation during processing and operation of the article. Specifically, the barrier layer is configured to protect metallic silver during deposition of additional layers over a stack including the reflective layer and the barrier layer, in particular during deposition of additional layers containing oxygen, such as metal oxides. Metallic silver easily oxidizes, which causes degradation of various characteristics of the reflective layer, such as conductivity, transparency, reflectivity, and the like.

In some embodiments, the article includes an additional reflective layer disposed over the barrier layer and an additional barrier layer disposed over the additional reflective layer. The additional reflective layer may include metallic silver, while the additional barrier layer may include nickel, chromium, titanium, and aluminum. In some embodiments, the additional reflective layer has the same composition and/or thickness as the reflective layer. The additional barrier layer may have the same composition and/or thickness as the barrier layer. In some embodiments, a dielectric layer may be provided in between the reflective layer and the additional reflective layer.

In some embodiments, an article includes a substrate, a bottom diffusion layer disposed over the substrate, a bottom dielectric layer disposed over the bottom diffusion layer, a seed layer disposed over the bottom dielectric layer, a reflective layer disposed over and directly interfacing the seed layer, a barrier layer disposed over and directly interfacing the reflective layer, a top dielectric layer disposed over the barrier layer, and a top diffusion layer disposed over the top dielectric layer. The bottom diffusion layer may include silicon nitride, while the bottom dielectric layer may include one of $TiO_2$, $SnO_2$, or ZnSn in an amorphous phase. The bottom dielectric layer may have a thickness of between 100 Angstroms and 300 Angstroms. The seed layer may include one of ZnO, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, or $MoO_3$ in a crystalline phase. The seed layer may have a thickness of between 50 Angstroms and 200 Angstroms. The reflective layer may include metallic silver and have a thickness of between 50 Angstroms and 200 Angstroms. The barrier layer may include nickel, chromium, titanium, and aluminum. The concentration of nickel in the barrier layer may be between about 5% by weight and 10% by weight, while the concentration of chromium in the barrier layer may be between about 25% by weight and 30% by weight. The concentration of titanium in the barrier layer may be between about 30% by weight and 35% by weight, while the concentration of aluminum in the barrier layer may be between about 30% by weight and 35% by weight. In some embodiments, the concentration of nickel in the barrier layer may be between about 5% by weight and 20% by weight, while the concentration of chromium in the barrier layer may be between about 15% by weight and 40% by weight. The concentration of titanium in the barrier layer may be between about 20% by weight and 40% by weight, while the concentration of aluminum in the barrier layer may be between about 20% by weight and 40% by weight.

The barrier layer may be configured to protect metallic silver of the reflective layer from oxidation during processing and operation of the article. The top dielectric layer may include one of $TiO_2$, $SnO_2$, or ZnSn in an amorphous phase. The top dielectric layer may have a thickness of between 50 Angstroms and 1000 Angstroms or, more specifically, between 100 Angstroms and 300 Angstroms. The top diffusion layer may include silicon nitride.

Provided also a method of forming an article. The method may involve providing a substrate, forming a reflective layer over the substrate, forming a barrier layer over the reflective layer, and forming a dielectric layer over the barrier layer. The reflective layer is formed by sputtering silver in a non-reactive environment. The barrier layer may be formed by co-sputtering nickel, chromium, titanium, and aluminum in the same or different reactive or non-reactive environment. In some embodiments, the environment used during formation of the reflective layer is maintained until the barrier layer is formed. At least, the reflective layer may not be exposed to an oxidizing environment until the barrier layer is formed. The dielectric layer may be formed by sputtering titanium or tin in an oxygen containing environment. The barrier layer prevents oxygen in the oxygen containing environment from reach and reacting with metallic silver in the reflective layer.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

Figure 1:
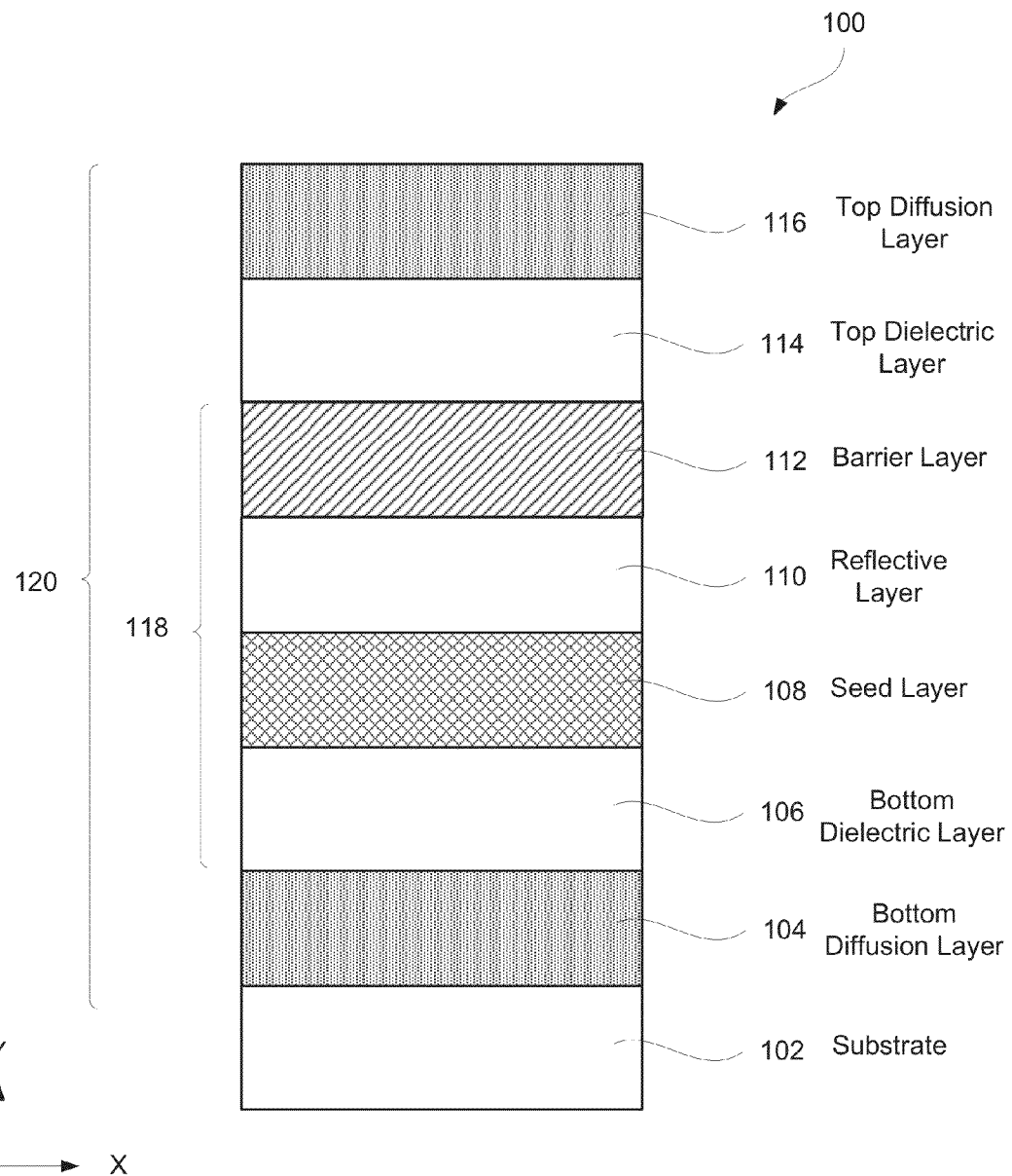
FIG. 1 is a schematic illustration of an article including a substrate and a stack of layers including one reflective layer disposed over the substrate, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

The electrical conductivity, reflectivity, transparency, and other relevant characteristics of a silver layer in low-E and other types of coatings heavily depend on the quality of the layer. The quality characteristics include the layer's texture, crystallinity, oxidation, and other related parameters. The oxidation of silver, in particular, should be prevented during subsequent processing, e.g., deposition of a dielectric oxide layer over the silver layer, and operation of the article that includes the silver layer. One having ordinary skills in the art would understand that silver is very sensitive to presence of oxygen and can be easily oxidized. At the same time, silver oxide characteristics are quite different from that of metallic silver and may negatively interfere with low-E and other applications of metallic silver.

A barrier layer may be used to protect the silver layer. The barrier layer may be disposed over the silver layer, in some embodiments, directly over the silver layer such that the barrier layer directly interfaces the silver layer and no other layers are provided in between the two layers. Other layers of the stack (e.g., a dielectric layer, a seed layer, a diffusion layer), which may be needed for particular applications, may be formed over the barrier layer. The barrier layer prevents oxygen from reaching the silver layer and, therefore, should have good oxygen diffusion blocking characteristics. These characteristics may be described directly by, for example, specifying oxygen permeability of the barrier layer, or indirectly by, for example, comparing performance of articles including these layers to the ones that do not or have different layers. For example, transparency and sheet resistance may be used as two operating metrics commonly used for low-E applications.

The barrier layer should be distinguished from other diffusion layers in the stack that are not directly interfacing the silver layer and that are typically formed by nitrides, such as silicon nitride. Furthermore, the barrier layer should be sufficiently transparent.

The oxygen blocking characteristics drive for thicker barrier layers, while the transparency characteristics drive for thinner ones. This contradiction can be addressed, to a certain extent, by specific compositions of the barrier layers. In some embodiments, the barrier layers are formed from quaternary alloys, i.e., an alloy formed by four constituents or, more specifically, by four metals. A combination of nickel, chromium, titanium, and aluminum may be used for this type of alloys. In some embodiments, this combination of four metals may also include oxygen. It should be noted that these alloys are different from binary alloys conventionally used for barrier layers, such as nickel chromium alloys, nickel titanium alloys, and titanium aluminum alloys. The binary alloys demonstrated various problems, such as being excessively absorptive and impacting transmission of visible light, interfering with dispersion of the silver layer, diffusing into the silver layer and increasing emissivity, difficulty in processing, and other like problems. Various experiments have been conducted to demonstrate superior performance of the quaternary alloys relative to the conventional binary alloys as described below with reference to FIGS. 5 and 6.

The quaternary alloys described herein are used as barrier layers to protect silver reflective layers and for improving the overall durability of the entire low-E stack. These materials have demonstrated improved stack emissivity, transmission and color neutrality before and after low-E glass tempering. Various quaternary alloys, including different alloys formed by the same four metals (i.e., nickel, chromium, titanium, and aluminum) were screened using High Productivity Combinatorial™ (HPC™) techniques (High Productivity Combinatorial™ and HPC™ are trademarks of Intermolecular, Inc.). Substantially improved transmission and emissivity characteristics have been identified for certain compositions of nickel, chromium, titanium, and aluminum. In some embodiments, a barrier layer includes between 5-10% by weight of nickel, between 25-30% by weight of chrome, between 30%-35% by weight of aluminum and between 30%-35% by weight of titanium. Other concentration ranges listed elsewhere in this disclosure may be used as well. These material combinations allow using relative thin barrier layers (e.g., 5-30 Angstroms thick) that have high transparency and still provide sufficient protection to the silver reflector and have low resistivity. For example, the quaternary alloys described herein have low absorption in visible light range. Specifically, low-e stacks that utilize these barrier layers can be tuned to show neutral or near neutral color. They also have good adhesion to silver reflective layers. Furthermore, specific deposition conditions are provided to yield barrier layers with desired compositions, thicknesses, conformality, and other characteristics.

Examples of Low-E Coatings

A brief description of low-E coatings is provided for context and better understanding of various features associated with barrier layers and silver reflective layers. One having ordinary skills in the art would understand that these barrier and silver reflective layers may be also used for other applications, such as light emitting diodes (LED), reflectors, and other like applications. Some characteristics of low-E coatings are applicable to these other applications as well. For purposes of this disclosure, low-E is a quality of a surface that emits low levels of radiant thermal energy. Emissivity is the value given to materials based on the ratio of heat emitted compared to a blackbody, on a scale of 0 (for a perfect reflector) to 1 (for a back body). The emissivity of a polished silver surface is 0.02. Reflectivity is inversely related to emissivity. When values of reflectivity and emissivity are added together, their total is equal 1.

FIG. 1 is a schematic illustration of an article 100 including a substrate 102 and a stack 120 of layers 104-116, in accordance with some embodiments. Specifically, stack 120 includes one reflective layer 110 disposed over substrate 102 and protected by a barrier layer 112. Other layers in stack 120 may include bottom diffusion layer 104, top diffusion layer 114, bottom dielectric layer 106, top dielectric layer 114, and seed layer 108. Each one of these components will now be described in more details. One having ordinary skills in the art would understand that the stack may include fewer layer or more layers as, for example, described below with reference to FIGS. 2 and 3.

Substrate 102 can be made of any suitable material. Substrate 102 may be opaque, translucent, or transparent to the visible light. For example, for low-E applications, the substrate may be transparent. Specifically, a transparent glass substrate may be used for this and other applications. For purposes of this disclosure, the term "transparency" is defined as a substrate characteristic related to a visible light transmittance through the substrate. The term "translucent" is defined as a property of passing the visible light through the substrate and diffusing this energy within the substrate, such that an object positioned on one side of the substrate is not visible on the other side of the substrate. The term "opaque" is defined as a visible light transmittance of 0%. Some examples of suitable materials for substrate 102 include, but are not limited to, plastic substrates, such as acrylic polymers (e.g., polyacrylates, polyalkyl methacrylates, including polymethyl methacrylates, polyethyl methacrylates, polypropyl methacrylates, and the like), polyurethanes, polycarbonates, polyalkyl terephthalates (e.g., polyethylene terephthalate (PET), polypropylene terephthalates, polybutylene terephthalates, and the like), polysiloxane containing polymers, copolymers of any monomers for preparing these, or any mixtures thereof. Substrate 102 may be also made from one or more metals, such as galvanized steel, stainless steel, and aluminum. Other examples of substrate materials include ceramics, glass, and various mixtures or combinations of any of the above.

Bottom diffusion layer 104 and top diffusion layer 116 may be two layers of stack 120 that protect the entire stack 120 from the environment and improve chemical and/or mechanical durability of stack 120. Diffusion layers 104 and 116 may be made from the same or different materials and may have the same or different thickness. In some embodiments, one or both diffusion layers 104 and 116 are formed from silicon nitride. In some embodiments, silicon nitride may be doped with aluminum and/or zirconium. The dopant concentration may be between about 0% to 20% by weight. In some embodiments, silicon nitride may be partially oxidized. Silicon nitride diffusion layers may be silicon-rich, such that their compositions may be represented by the following expression, $Si_XN_Y$, where the X-to-Y ratio is between about 0.8 and 1.0. The refraction index of one or both diffusion layers 104 and 116 may be between about 2.0 and 2.5 or, more specifically, between about 2.15 to 2.25. The thickness of one or both diffusion layers 104 and 116 may be between about 50 Angstroms and 300 Angstroms or, more specifically, between about 100 Angstroms and 200 Angstroms.

In addition to protecting stack 120 from the environment, bottom diffusion layer 104 may help with adhering bottom dielectric layer 106 to substrate 102. Without being restricted to any particular theory, it is believed that deposition of dielectric layer 106 and in particular subsequent heat treatment of this layer results in heat-induced mechanical stresses at the interfaces of dielectric layer 106. These stresses may cause delamination of dielectric layer 106 from other layers and coating failure. A particular example is a titanium oxide layer deposited directly onto the glass substrate. However, when silicon nitride diffusion layer 104 is provided between bottom dielectric layer 106 and substrate 102, the adhesion within this three-layer stack remains strong as evidenced by improved durability, especially after heat treatment.

Typically, each reflective layer provided in a stack is surrounded by two dielectric layers, e.g., bottom dielectric layer 106 and top dielectric layer 114 as shown in FIG. 1. Dielectric layers 106 and 114 are used to control reflection characteristics of reflective layer 110 as well as overall transparency and color of stack 120 and, in some embodiments, of article 100. Dielectric layers 106 and 114 may be made from the same or different materials and may have the same or different thickness. In some embodiments, one or both dielectric layers 106 and 114 are formed from $TiO_2$, ZnO, $SnO_2$, SiAlN, or ZnSn. In general, dielectric layers 106 and 114 may be formed from various oxides, stannates, nitrides, and/or oxynitrides. In some embodiments, one or both dielectric layers 106 and 114 may include dopants, such as Al, Ga, In, Mg, Ca, Sr, Sb, Bi, Ti, V, Y, Zr, Nb, Hf, or Ta. Dielectric layers 106 and 114 can each include different dielectric materials with similar refractive indices or different materials with different refractive indices. The relative thicknesses of the dielectric films can be varied to optimize thermal-management performance, aesthetics, and/or durability of article 100.

The materials of dielectric layers 106 and 114 may be in amorphous states, crystalline states, or a combination of two or more states. Sometimes these states are referred to as phases. In some embodiments, when stack 120 includes seed layer 108, bottom dielectric layer 106 may be in an amorphous state. Alternatively, when stack 120 does not include seed layer 108, bottom dielectric layer 106 may be in a crystalline state and function as a nucleation template for overlying layers, e.g., reflective layer 110. The thickness of dielectric layers 106 and 114 may be between about 50 Angstroms and 1000 Angstroms or, more specifically, between 100 Angstroms and 300 Angstroms.

In some embodiments, stack 120 includes seed layer 108. Seed layer 108 may be formed from ZnO, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, $MoO_3$, various combinations thereof, or other metal oxides. The material of seed layer 108 may be in a crystalline state. Seed layer 108 may function as a nucleation template for overlying layers, e.g., reflective layer 110. In some embodiments, the thickness of seed layer 108 is between about 50 Angstroms and 200 Angstroms, such as about 100 Angstroms.

Stack 120 includes reflective layer 110, which is formed from silver. The thickness of this layer may be between about 50 Angstroms and 200 Angstroms or, more specifically, between about 100 Angstroms and 150 Angstroms.

As noted above, stack 120 also include barrier layer 112 to protect reflective layer 110 from oxidation and other damage. Barrier layer 112 may be formed from a quaternary alloy that includes nickel, chromium, titanium, and aluminum. The concentration of each metal in this alloy is selected to provide adequate transparency and oxygen diffusion blocking properties. In some embodiments, a combined concentration of nickel and chromium in the barrier layer is between about 20% by weight and 50% by weight or, more specifically, between about 30% by weight and 40% by weight. A weight ratio of nickel to chromium in the alloy may be between about 3 and 5 or, more specifically, about 4. A weight ratio of titanium to aluminum is between about 0.5 and 2, or more, specifically about 1. In some embodiments, the concentration of nickel in the barrier layer is between about 5% and 10% by weight, the concentration of chromium—between about 25% and 30% by weight, the concentration of titanium and aluminum—between about 30% and 35% by weight each. This composition of barrier layer 112 may be achieved by using one or more sputtering target containing nickel, chromium, titanium, and aluminum, controlling concentration of these metals in the sputtering targets, and controlling power levels applied to each sputtering target. For example, two sputtering targets may be used. The first target may include nickel and chromium, while the second target may include titanium and aluminum. The weight ratio of nickel to chromium in the first target may be about 4, while the weight ratio of titanium to aluminum in the second target may be about 1. These weight ratios may be achieved by using corresponding alloys for the entire target, target inserts made from different materials, or other features allowing combine two or more materials in the same target. The two targets may be exposed to different power levels. In the above example, the first target may be exposed to twice smaller power than the second target to achieve the desired composition. The barrier can be deposited substantially free of oxygen (e.g., predominantly as a metal) in the inert environment (e.g., argon environment). Alternatively, some oxidant (e.g., 15% by volume of $O_2$ in Ar) may be used to oxide the four metals. The concentration of oxygen in the resulting barrier layer may be between about 0% and 5% by weight.

In some embodiments, nickel, chromium, titanium, and aluminum are all uniformly distributed throughout the barrier layer, i.e., its entire thickness and coverage area. Alternatively, the distribution of components may be non-uniform. For example, nickel and chromium may be more concentrated along one interface than along another interface. In some embodiments, a portion of the barrier layer near the interface with the reflective layer includes more nickel for better adhesion to the reflective layer. In some embodiments, substantially no other components other than nickel, chromium, titanium, and aluminum are present in barrier layer 112.

Barrier layer 112 may be amorphous metal. For purposes of this disclosure, an amorphous metal (also known metallic glass or glassy metal) is a solid metallic material, usually an alloy, with a disordered atomic-scale structure.

Without being restricted to any particular theory, it is believed that when the barrier layer is exposed to oxygen (e.g., during deposition of the top dielectric), some metals of the barrier layer (e.g., Cr, Ti, and Al) will be easily oxidized thereby consuming oxygen and preventing oxygen from penetrating through the barrier layer and reaching the reflective layer. As such, the barrier layer may be considered as a scarifying layer.

In some embodiments, barrier layer 112 has a thickness of between about 1 Angstroms and 100 Angstroms or, more specifically, between about 5 Angstroms and 30 Angstroms, and even between about 10 Angstroms and 20 Angstroms. While larger thickness may be more desirable from oxygen barrier perspectives, the excessive thickness may cause transparency problems.

Top dielectric layer 114 may be similar to bottom dielectric layer 106 described above. Likewise, top diffusion layer 116 may be similar to bottom diffusion layer 104 described above. In some embodiments, top diffusion layer 116 (e.g., formed from silicon nitride) may be more stoichiometric than bottom diffusion layer 104 to give better mechanical durability and give smoother surface. Bottom diffusion layer 104 (e.g., formed from silicon nitride) can be slightly metallic to make film denser for better diffusion effect.

The overall stack 120 may have a sheet resistance of between about 6 Ohm/square to 8 Ohm/square for a thickness of a silver reflective layer between 80 Angstroms and 90 Angstroms. The sheet resistance may be between about 2 Ohm/square to 4 Ohm/square for a thickness of a silver reflective layer between 100 Angstroms and 140 Angstroms.

In some embodiments, a stack may include multiple reflective layers in order to achieve a specific performance. For example, the stack may include two, three, or more reflective layers. The multiple reflective layers may have the same or different composition and/or thicknesses. Each new reflective layer may have a corresponding dielectric layer (e.g., at least one layer disposed in between two reflective layers), a seed layer, and a barrier layer. FIG. 1 illustrates a portion 118 of stack 120 that may be repeated. Stack portion includes dielectric layer 106 (or dielectric layer 114), seed layer 108, reflective layer 110, and barrier layer 112. In some embodiments, portion 118 may not include seed layer 108.

Figure 2:
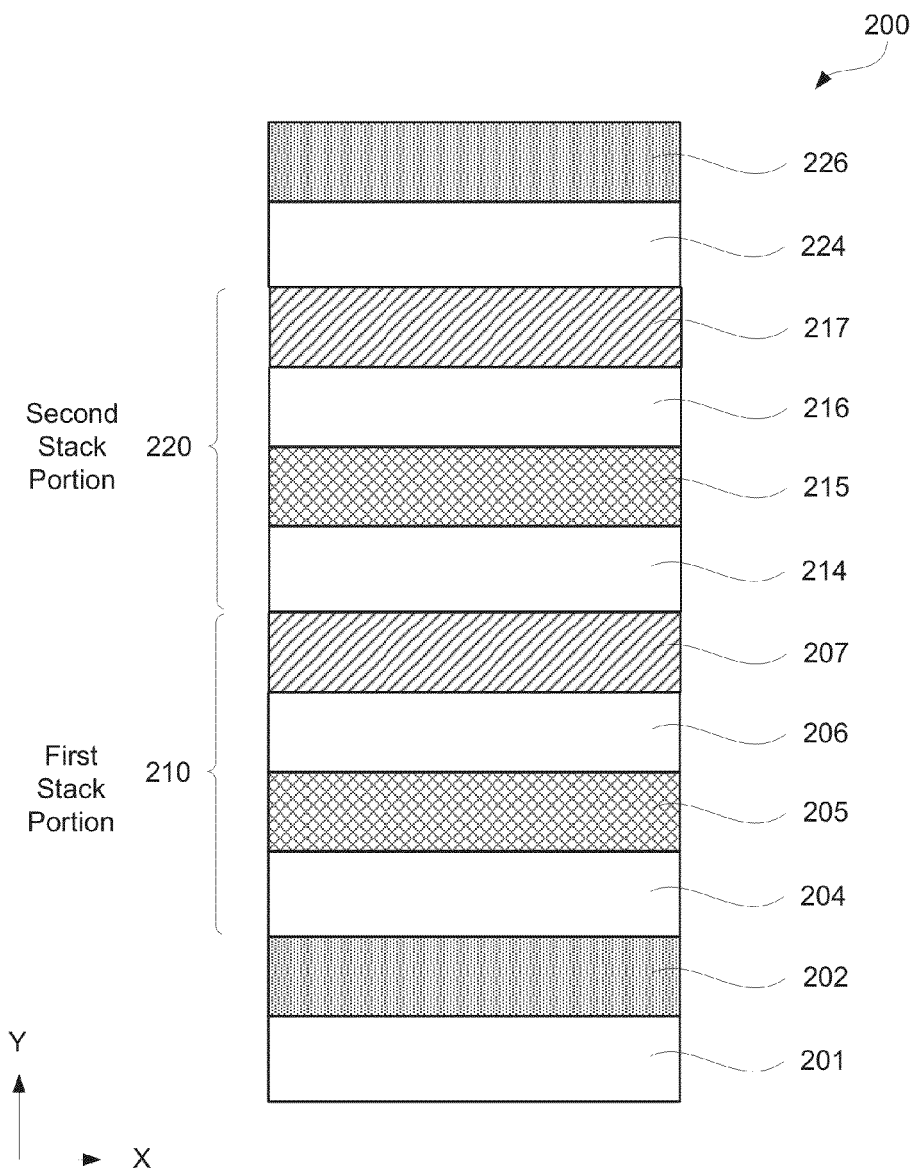
FIG. 2 is a schematic illustration of another article including a substrate and a stack of layers including two reflective layers disposed over the substrate, in accordance with some embodiments.

FIG. 2 is a schematic illustration of another article 200 including a substrate 201 and a stack including two reflective layers 206 and 216, in accordance with some embodiments. Each one of reflective layers 206 and 216 is a part of a separate stack portion that includes other layers, i.e., reflective layer 206 is a part of first stack portion 210, while reflective layer 216 is a part of second stack portion 220. Other layers in first stack portion 210 include dielectric layer 204, seed layer 205, and barrier layer 207. Likewise, in addition to reflective layer 216, second stack portion 220 includes dielectric layer 214, seed layer 215, and barrier layer 217. It should be noted that reflective layers 206 and 216 are separated by only one dielectric layer 214. The overall article 200 also includes bottom diffusion layer 202, top dielectric layer 224, and top diffusion layer 226.

Figure 3:
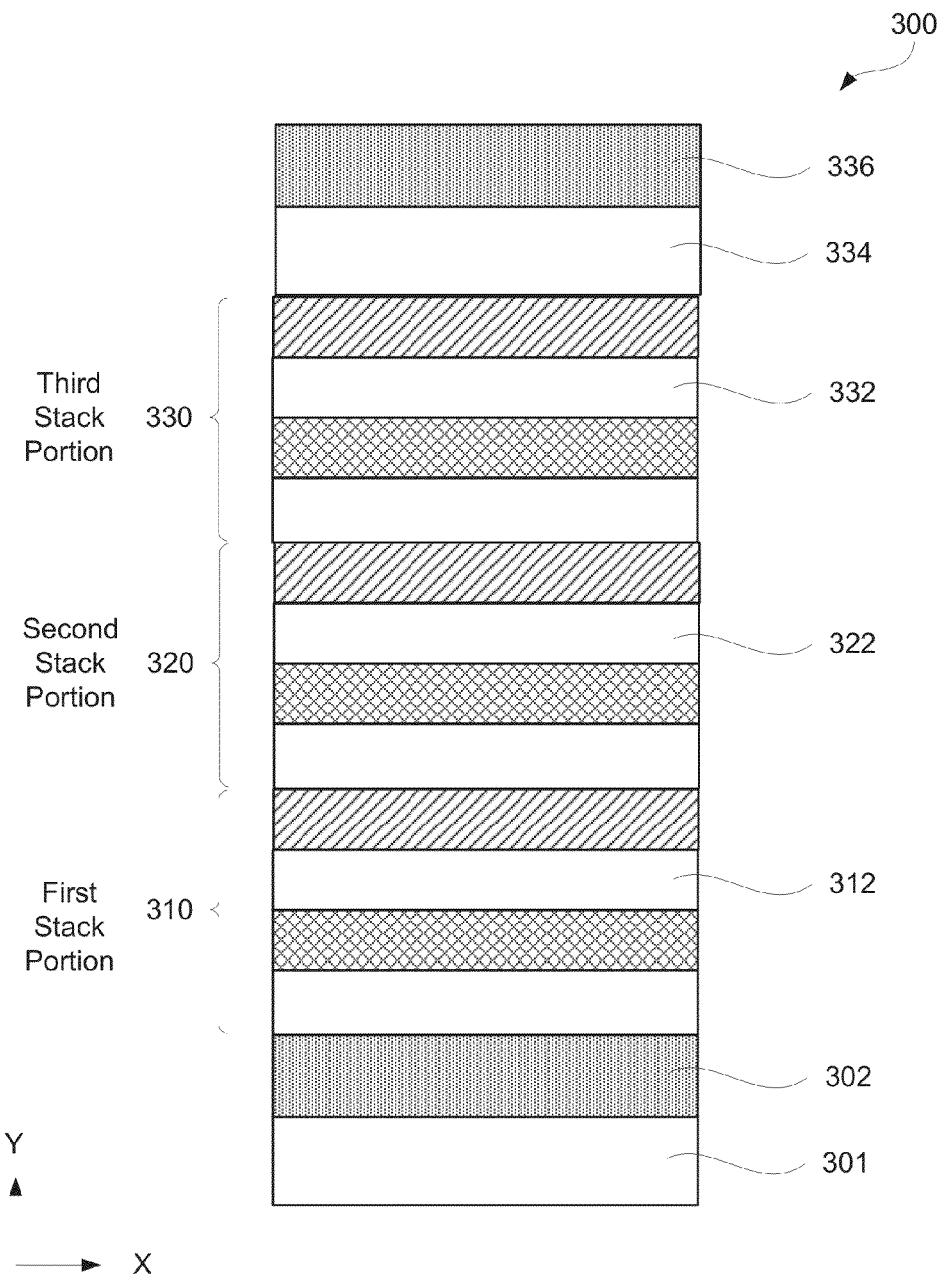
FIG. 3 is a schematic illustration of yet another article including a substrate and a stack of layers including three reflective layers disposed over the substrate, in accordance with some embodiments.

FIG. 3 is a schematic illustration of yet another article 300 including a substrate 301 and three reflective layers, each being a part of as separate stack portion. Specifically, article 300 includes first stack portion 310 having reflective layer 312, second stack portion 320 having reflective layer 322, and third stack portion 330 having reflective layer 332. Other layers of article 300 also bottom diffusion layer 302, top dielectric layer 334, and top diffusion layer 336.

Processing Examples

Figure 4:
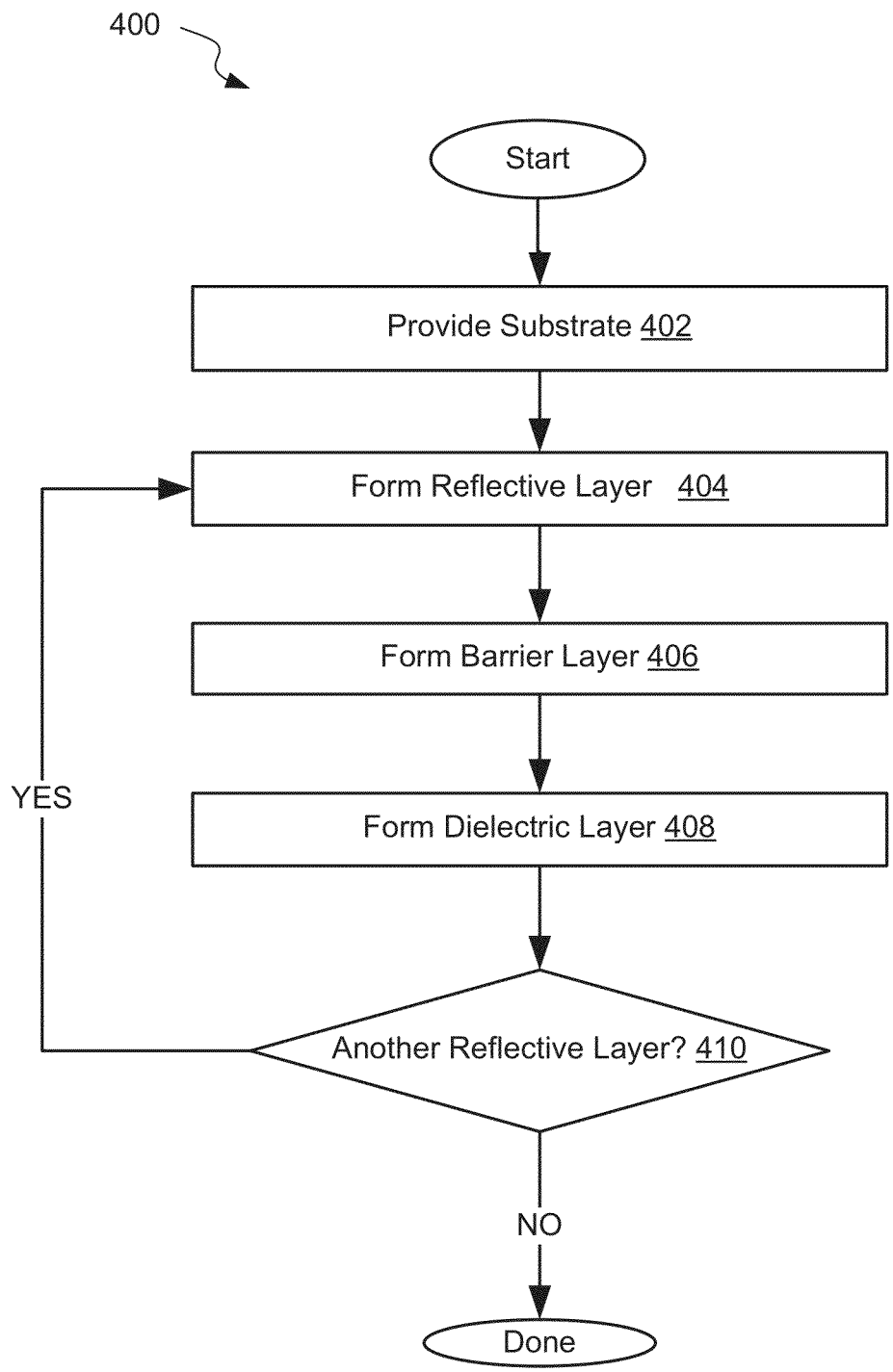
FIG. 4 is a process flowchart corresponding to a method for forming an article including a reflective layer and a barrier layer for protecting materials in this reflective layer from oxidation, in accordance with some embodiments.

FIG. 4 is a process flowchart corresponding to a method 400 of forming an article including a silver reflective layer and a barrier layer for protecting this reflective layer from oxidation, in accordance with some embodiments. Method 400 may commence with providing a substrate during operation 402. In some embodiments, the provided substrate is a glass substrate. The substrate may include one or more previous deposited layers. For example, the substrate may include a bottom diffusion layer, a bottom dielectric layer, and a seed layer. In some embodiments, one of more of these layers may not be present on the substrate. Various examples of these layers and substrates are described above with reference to FIG. 1.

Method 400 may proceed with forming a reflective layer over the substrate during operation 404 or, more specifically, over one or more layers previously formed on the provided substrate. This operation may involve sputtering silver in a non-reactive environment. The silver barrier layer was deposited in argon environment at a pressure of 2 milliTorr using 90 W power. The resulting deposition rate was about 2.9 Angstroms per second. The target to substrate spacing was about 240 millimeters. The thickness of the reflective layer may be between about 50 Angstroms and 200 Angstroms. In some embodiments, the same reflective layer is provided in all site isolated regions of the substrate. In other words, the reflective layer has the same composition and thickness in all site isolated regions of the substrate. This uniformity may be used to provide control and vary, for example, parameters of another layer.

Method 400 may proceed with forming a barrier layer over the reflective layer during operation 406. As noted above, the reflective layer may be formed from a quaternary alloy including nickel, chromium, titanium, and aluminum that is formed by co-sputtering of these four metals in a non-reactive environment. In some embodiments, the barrier layer is deposited in the same processing chamber as the reflective layer without breaking the vacuum in the chamber. Overall, the reflective layer needs to be protected from oxygen prior to deposition of the barrier layer. In some embodiments, a partially fabricated article may be maintained in an oxygen-free environment after forming the reflective layer and prior to forming the barrier layer.

In some embodiments, a barrier layer is formed in a combinatorial manner such that one of more parameters of this layer is varied from one site isolated region to another. For example, the composition or the thickness of the barrier layer may vary in a combinatorial manner. The composition may be varied by using, for example, multiple sputtering targets and varying a ratio of power levels applied to these targets for different site isolated-regions. In one example (further described below), one target may include nickel and chromium, while another target may include titanium and aluminum. As such, a combined concentration of nickel and chromium may vary from 0% by weight to 100% by weight. Varying this concentration and other parameters allows finding best performing combinations. The composition may be also varied by controlling deposition environment, e.g., oxygen concentration in the environment. In some embodiments, the barrier layer has a different concentration of oxygen from one site isolated region to another.

Operation 406 may use a single sputtering target that includes all four metals. Alternatively, multiple targets, each including one or more metals, may be used. When a target includes multiple metals, these metals may be in a form of an alloy arranged into a unified body or may be present as separate components of the target. The composition of metals in the one or more targets may correspond to the desired composition of the barrier layer. For example, a target including 5-10% by weight of nickel, 25-30% by weight of chromium, 30-35% by weight of titanium, and 30-35% by weight of aluminum may be used. In some embodiments, one target may include nickel and chromium (e.g., having a 4:1 weight ratio of nickel to chromium) and another target may include titanium and aluminum (e.g., having a 1:1 weight ratio). The power level used on the titanium-aluminum target may double of that used for the nickel-chromium level, e.g., 200 W and 100 W respectively for 3-inch targets positioned about 12 inches away from the substrate resulting in a 2-4 Angstroms per minute deposition rate.

Method 400 may then proceed with forming a dielectric layer over the barrier layer during operation 408. This operation may involve sputtering titanium or tin in an oxygen containing environment. During this operation, the barrier layer prevents oxygen in the oxygen containing environment from reaching and reacting with metallic silver in the reflective layer.

If another reflective layer needs to be deposited on the substrate, operations 404-408 may be repeated as indicated by decision block 410.

Experimental Results

Figure 5:
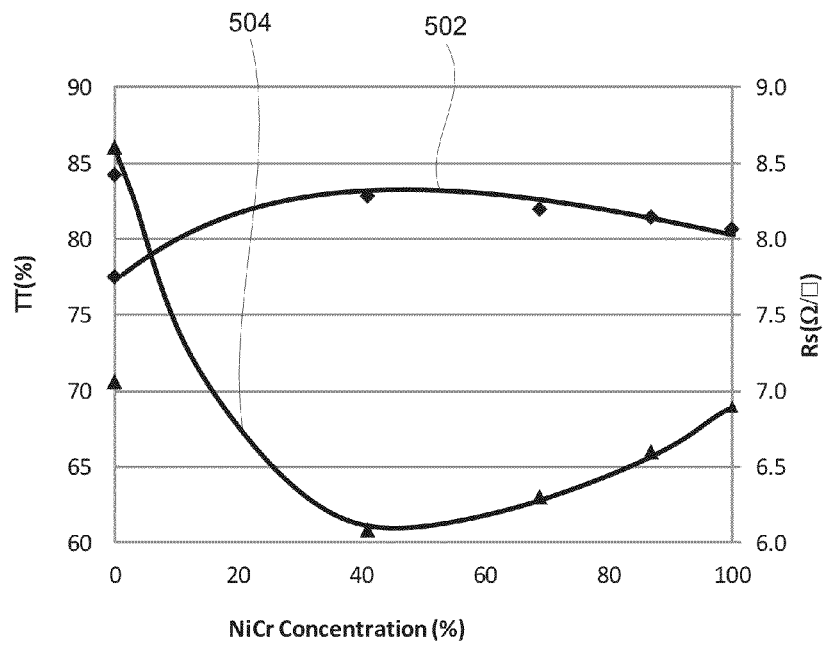
FIG. 5 is a plot of a total transmission and a sheet resistance as a function of a combined concentration of nickel and chrome in the barrier layers.

FIG. 5 is a plot of a total transmission and a sheet resistance as a function of a combined concentration of nickel and chrome in the barrier layers. The concentration ranges from 0% by weight (i.e., the barrier layer including only titanium and aluminum in a form of a binary alloy) to 100% by weight (i.e., the barrier layer including only nickel and chromium also in a form of a binary alloy). Two sputtering targets, one including 50% by weight of titanium and 50% by weight of aluminum, and the other one including 80% by weight of nickel and 20% by weight of chromium, were used to generate all samples reflected on the plot. As such, weight ratios of titanium to aluminum in all samples were the same (i.e., one). Likewise, weight ratios of nickel to chromium in all samples were the same (i.e., four). The combined concentration of nickel and chrome in the samples were varied by adjusting relative powers used on the targets. The thickness of all samples was 10 Angstroms to 20 Angstroms.

The barrier layer samples were formed over a glass substrate (i.e., 3 millimeter glass) that already had a 164 Angstroms thick titanium oxide dielectric layer, a 100 Angstroms thick zinc oxide seed layer, and a 90 Angstroms thick silver reflective layer. The barrier layer samples were also covered with a 240 Angstroms thick zinc-tin oxide. Diffusion layers were not included in these test samples.

The test samples were analyzed for total transmission and sheet resistance. The Perkin-Elmer spectrometer was used for transmission measurement such that 100% is deemed to be completely transparent, while 0% is deemed to be completely opaque. CDE Resmap was used to measure sheet resistance. The results of these tests for different test samples are presented in FIG. 5. Specifically, line 502 represents the total transmission ratio (corresponding to the left vertical axis), while line 504 represents the sheet resistance (corresponding to the right vertical axis). It is generally desirable to have the highest total transmission and the lowest sheet resistance, which corresponds to emissivity, i.e., lower sheet resistance generally corresponds to lower emissivity. The two lines indicate that the combined concentration of nickel and chrome of about 30-40% by weight in the barrier layers performs the best. Furthermore, it is quite clear from FIG. 5 that quaternary alloys perform better than conventionally used binary alloys, which represented by 0% and 100% combined concentration of nickel and chromium.

Figure 6:
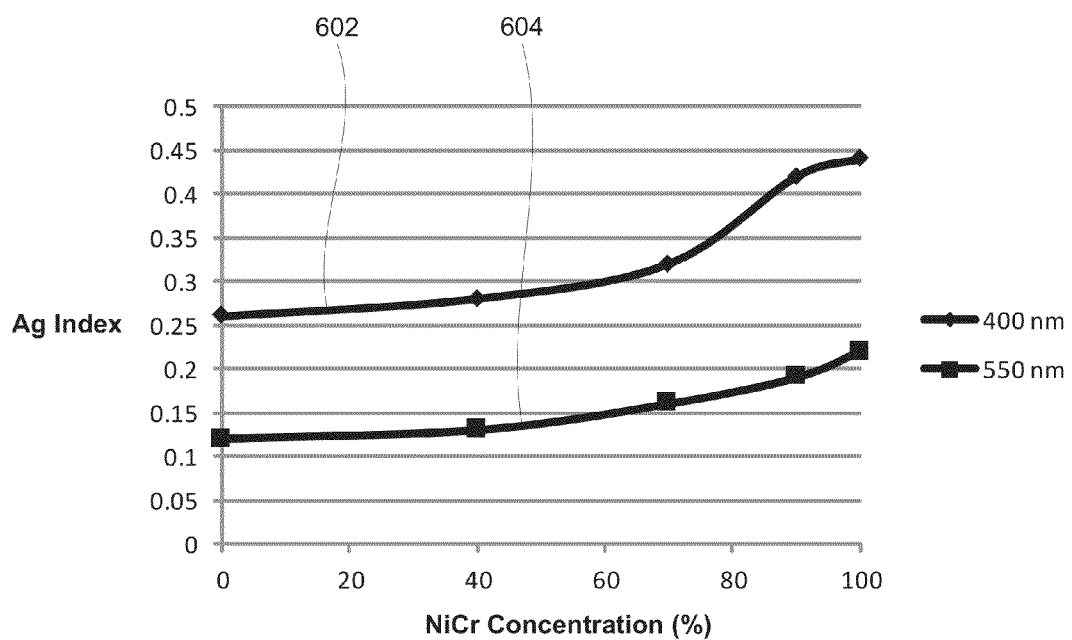
FIG. 6 is a plot of a silver index measured at two different wavelengths as a function of a combined concentration of nickel and chrome in the barrier layers.

The same samples were also tested for refractive index, which is in this context may be referred to as a silver index. Generally, the lower value of this index is more desirable. FIG. 6 is a plot of a silver index measured at two different wavelengths as a function of the combined concentration of nickel and chrome in the barrier layers of these samples. Specifically, line 602 corresponds to tests performed using 400 nm wavelength, while line 604 corresponds to tests performed using 550 nm wavelength. In general, it is better to have the value of silver index as low as possible. Even though both lines 602 and 604 indicate that is may be beneficial to have lower combined concentrations of nickel and chromium, nickel-chromium alloys tend to be more mechanically durable and adhere better to silver surfaces than titanium-aluminum alloys. Furthermore, as lines 602 and 604 indicate the effects of lowering combined concentrations of nickel and chromium diminishes below 50% by weight and effectively flattens out for lower values.

Figure 7:
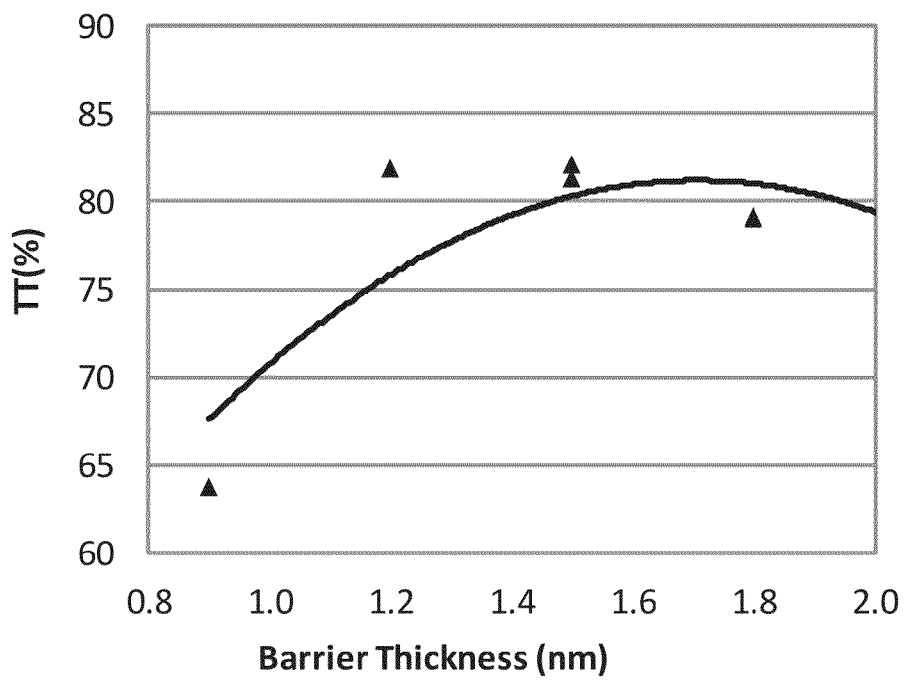
FIG. 7 is a plot of a total transmission of a stack including a barrier layer and a reflective layer as a function of the barrier layer thickness.
Figure 8:
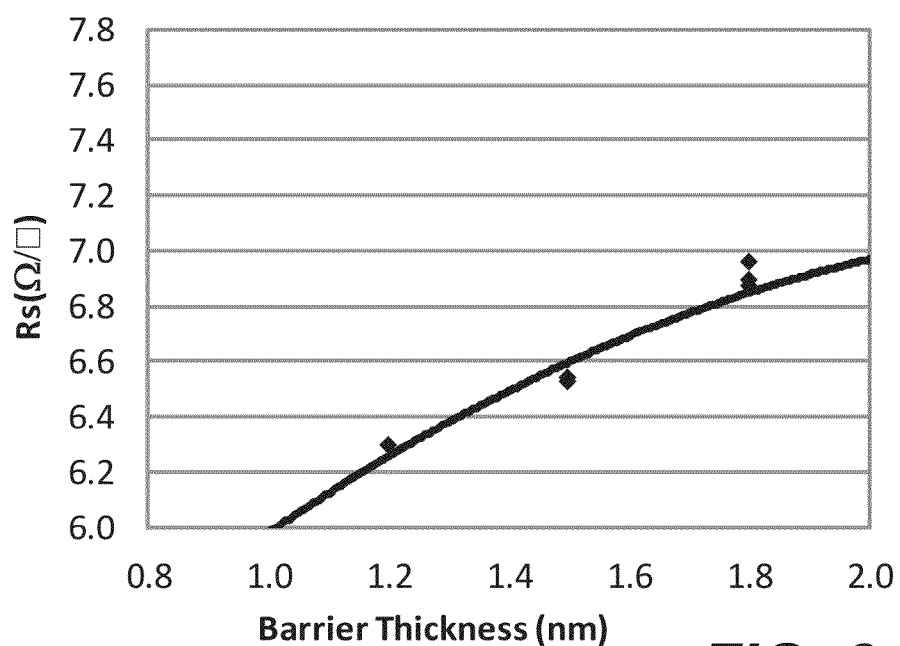
FIG. 8 is a plot of a sheet resistance of a stack including a barrier layer and a reflective layer as a function of the barrier layer thickness.

Samples having different barrier thicknesses were formed using the following composition: 55% of nickel, 14% of chromium, 16% of titanium, and 16% of aluminum (all by weight). The thicknesses ranged from 9 Angstroms to 18 Angstroms. Similar to the samples described above, these samples were formed over a glass substrate having a 164 Angstroms thick titanium oxide dielectric layer, a 100 Angstroms thick zinc oxide seed layer, and a 90 Angstroms thick silver reflective layer below the barrier layers and a 240 Angstroms thick zinc-tin oxide above the barrier layers. Diffusion layers were not included in these test samples either. The samples were tested for total transmission and sheet resistance. Specifically, FIG. 7 is a plot of a total transmission as a function of a barrier layer thickness, while FIG. 8 is a plot of a sheet resistance as a function of a barrier layer thickness. As the barrier layers got thicker, the total transmission decreased, which was expected. However, the total transmission also decreased as the barrier got thinner, i.e., below 12 Angstroms. Without being restricted to any particular theory, it is believed that this particular decrease in the total transmission is due to partial oxygen permittivity of the thinner barrier layers and oxidation of the silver reflective layer, which becomes less transmissive as a result of the oxidation. Without being restricted to any particular theory, it is believed that the increase in the sheet resistance as the barrier layer gets thicker is attributed to nickel diffusion into silver and degrading the resistance of the silver layer electrical properties.

In should be noted that the experiments described above with reference to FIGS. 7 and 8 were used to determine the desirable barrier thickness, which was then used in other experiments described in this section.

HPC Examples

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of articles including barrier layers. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning HPC processing techniques have also been successfully adapted to deposition processes such as physical vapor deposition (PVD), atomic layer deposition (ALD), and chemical vapor deposition (CVD). However, HPC processing techniques have not been successfully adapted to the development of articles including barrier layers, particularly when barrier layers are used for protecting silver based reflective layers.

Figure 9:
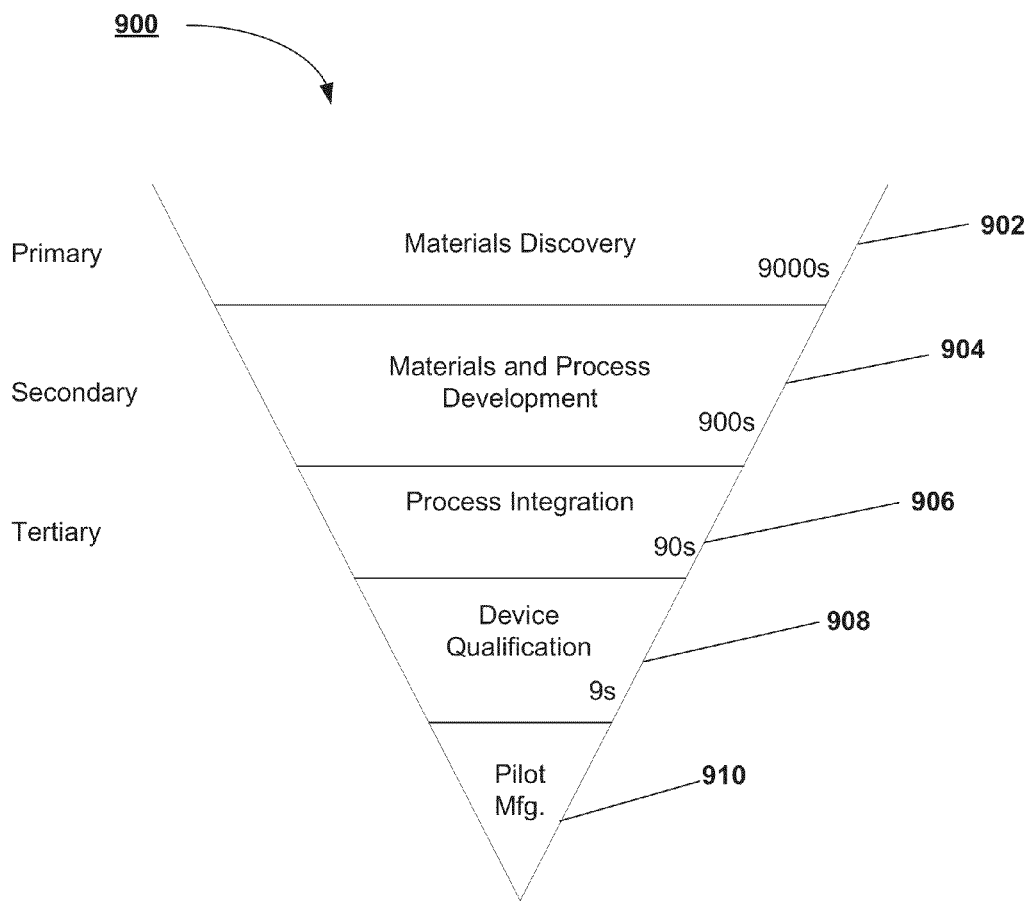
FIG. 9 is a schematic diagram for implementing combinatorial processing and evaluation.

FIG. 9 illustrates a schematic diagram 900 for implementing combinatorial processing and evaluation using primary, secondary, and tertiary screening. The schematic diagram 900 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 902. Materials discovery stage 902 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 904. Evaluation of the materials is performed using metrology tools such as electronic testers and imaging tools (i.e., microscopes).

The materials and process development stage 904 may evaluate hundreds of materials (i.e., a magnitude smaller than the primary stage) and may focus on the processes used to deposit or develop those materials. Promising materials and processes are again selected, and advanced to the tertiary screen or process integration stage 906 where tens of materials and/or processes and combinations are evaluated. The tertiary screen or process integration stage 906 may focus on integrating the selected processes and materials with other processes and materials.

The most promising materials and processes from the tertiary screen are advanced to device qualification 908. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 910.

The schematic diagram 900 is an example of various techniques that may be used to evaluate and select materials and processes for the development of new materials and processes. The descriptions of primary, secondary, etc. screening and the various stages 902-910 are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of articles manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating an article containing a barrier layer. A global optimum sequence order is therefore derived and as part of this derivation, the unit processes, unit process parameters, and materials used in the unit process operations of the optimum sequence order are also considered.

The embodiments described further analyze a portion or sub-set of the overall process sequence used to manufacture an article containing a barrier layer. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the article containing a barrier layer. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 10:
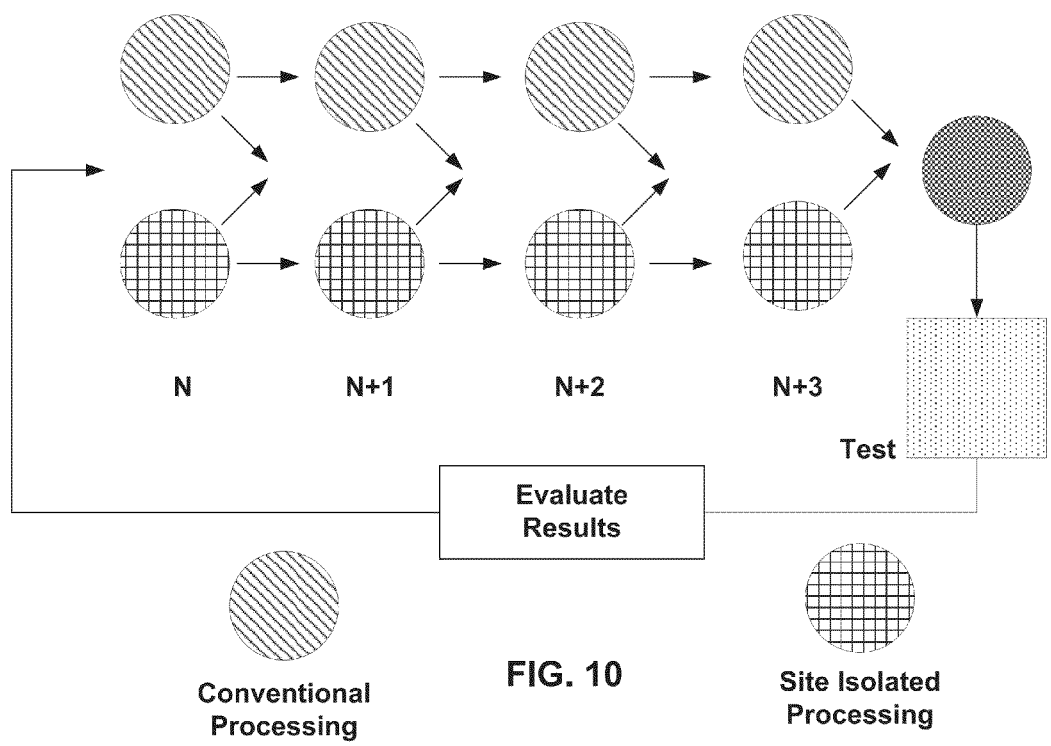
FIG. 10 is a schematic diagram for illustrating various process sequences using combinatorial processing and evaluation.

FIG. 10 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 10. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in barrier layer manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 11:
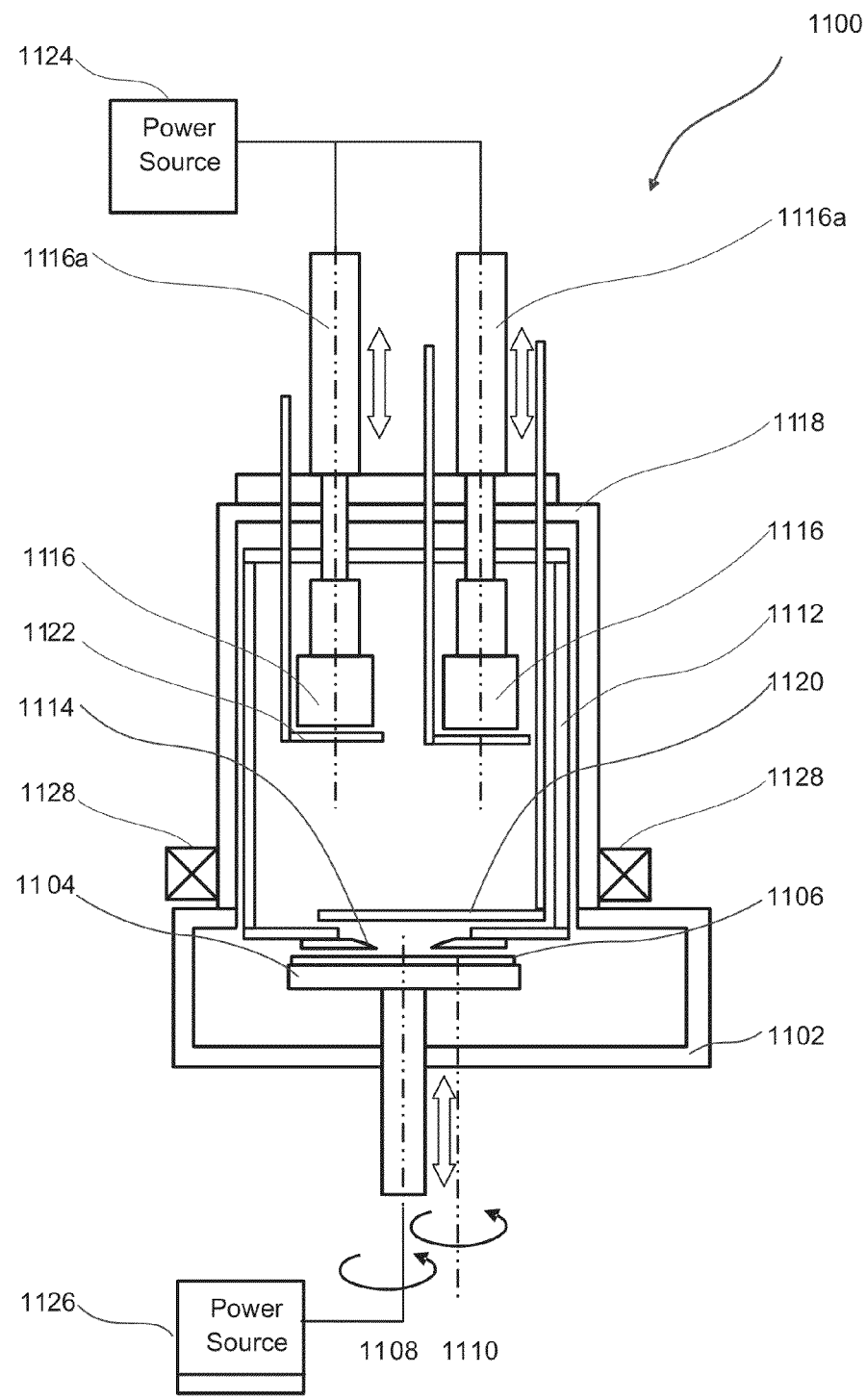
FIG. 11 illustrates a schematic diagram of a combinatorial PVD system according to some embodiments described herein.

FIG. 11 is a simplified schematic diagram illustrating a sputter chamber configured to perform combinatorial processing and full substrate processing in accordance with some embodiments of the invention. Processing chamber 1100 includes a bottom chamber portion 1102 disposed under top chamber portion 1118. Within bottom portion 1102, substrate support 1104 is configured to hold a substrate 1106 disposed thereon and can be any known substrate support, including but not limited to a vacuum chuck, electrostatic chuck or other known mechanisms. Substrate support 1104 is capable of both rotating around its own central axis 1108 (referred to as "rotation" axis), and rotating around an exterior axis 1110 (referred to as "revolution" axis). Such dual rotary substrate support is central to combinatorial processing using site-isolated mechanisms. Other substrate supports, such as an XY table, can also be used for site-isolated deposition. In addition, substrate support 1104 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 1126 provides a bias power to substrate support 1104 and substrate 1106, and produces a negative bias voltage on substrate 1106. In some embodiments power source 1126 provides a radio frequency (RF) power sufficient to take advantage of the high metal ionization to improve step coverage of vias and trenches of patterned wafers. In another embodiment, the RF power supplied by power source 1126 is pulsed and synchronized with the pulsed power from power source 1124. Further details of the power sources and their operation may be found in U.S. patent application Ser. No. 13/281,316 entitled "High Metal Ionization Sputter Gun" filed on Oct. 25, 2011 and is herein incorporated by reference for all purposes.

Substrate 1106 may be a conventional round 200 mm, 300 mm, or any other larger or smaller substrate/wafer size. In some embodiments, substrate 1106 may be a square, rectangular, or other shaped substrate. One skilled in the art will appreciate that substrate 1106 may be a blanket substrate, a coupon (e.g., partial wafer), or even a patterned substrate having predefined regions. In another embodiment, substrate 1106 may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion 1118 of chamber 1100 in FIG. 11 includes process kit shield 1112, which defines a confinement region over a radial portion of substrate 1106. Process kit shield 1112 is a sleeve having a base (optionally integrated with the shield) and an optional top within chamber 1100 that may be used to confine a plasma generated therein. The generated plasma will dislodge atoms from a target and the sputtered atoms will deposit on an exposed surface of substrate 1106 to combinatorial process regions of the substrate in some embodiments. In another embodiment, full wafer processing can be achieved by optimizing gun tilt angle and target-to-substrate spacing, and by using multiple process guns 1116. Process kit shield 1112 is capable of being moved in and out of chamber 1100, i.e., the process kit shield is a replaceable insert. In another embodiment, process kit shield 1112 remains in the chamber for both the full substrate and combinatorial processing. Process kit shield 1112 includes an optional top portion, sidewalls and a base. In some embodiments, process kit shield 1112 is configured in a cylindrical shape, however, the process kit shield may be any suitable shape and is not limited to a cylindrical shape.

The base of process kit shield 1112 includes an aperture 1114 through which a surface of substrate 1106 is exposed for deposition or some other suitable semiconductor processing operations. Aperture shutter 1120 which is moveably disposed over the base of process kit shield 1112. Aperture shutter 1120 may slide across a bottom surface of the base of process kit shield 1112 in order to cover or expose aperture 1114 in some embodiments. In another embodiment, aperture shutter 1120 is controlled through an arm extension which moves the aperture shutter to expose or cover aperture 1114. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 1114 may be a larger opening and plate 1120 may extend with that opening to either completely cover the aperture or place one or more fixed apertures within that opening for processing the defined regions. The dual rotary substrate support 1104 is central to the site-isolated mechanism, and allows any location of the substrate or wafer to be placed under the aperture 1114. Hence, the site-isolated deposition is possible at any location on the wafer/substrate.

A gun shutter, 1122 may be included. Gun shutter 1122 functions to seal off a deposition gun when the deposition gun may not be used for the processing in some embodiments. For example, two process guns 1116 are illustrated in FIG. 11. Process guns 1116 are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter 1122 can be transitioned to isolate the lifted process guns from the processing area defined within process kit shield 1112. In this manner, the process guns are isolated from certain processes when desired. It should be appreciated that slide cover plate 1122 may be integrated with the top of the process kit shield 1112 to cover the opening as the process gun is lifted or individual cover plate 1122 can be used for each target. In some embodiments, process guns 1116 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 1118 of chamber 1100 of FIG. 11 includes sidewalls and a top plate which house process kit shield 1112. Arm extensions 1116a, which are fixed to process guns 1116 may be attached to a suitable drive, e.g., lead screw, worm gear, etc., configured to vertically move process guns 1116 toward or away from a top plate of top chamber portion 1118. Arm extensions 1116a may be pivotally affixed to process guns 1116 to enable the process guns to tilt relative to a vertical axis. In some embodiments, process guns 1116 tilt toward aperture 1114 when performing combinatorial processing and tilt toward a periphery of the substrate being processed when performing full substrate processing. It should be appreciated that process guns 1116 may tilt away from aperture 1114 when performing combinatorial processing in another embodiment. In yet another embodiment, arm extensions 1116a are attached to a bellows that allows for the vertical movement and tilting of process guns 1116. Arm extensions 1116a enable movement with four degrees of freedom in some embodiments. Where process kit shield 1112 is utilized, the aperture openings are configured to accommodate the tilting of the process guns. The amount of tilting of the process guns may be dependent on the process being performed in some embodiments. Power source 1124 provides power for sputter guns 1116 whereas power source 1126 provides RF bias power to an electrostatic chuck to bias the substrate when necessary. It should be appreciated that power source 1124 may output a direct current (DC) power supply or a radio frequency (RF) power supply.

Chamber 1100 includes auxiliary magnet 1128 disposed around an external periphery of the chamber. The auxiliary magnet 1128 is located in a region defined between the bottom surface of sputter guns 1116 and a top surface of substrate 1106. Magnet 1128 may be either a permanent magnet or an electromagnet. It should be appreciated that magnet 1128 is utilized to provide more uniform bombardment of argon ions and electrons to the substrate in some embodiments.

Figure 12:
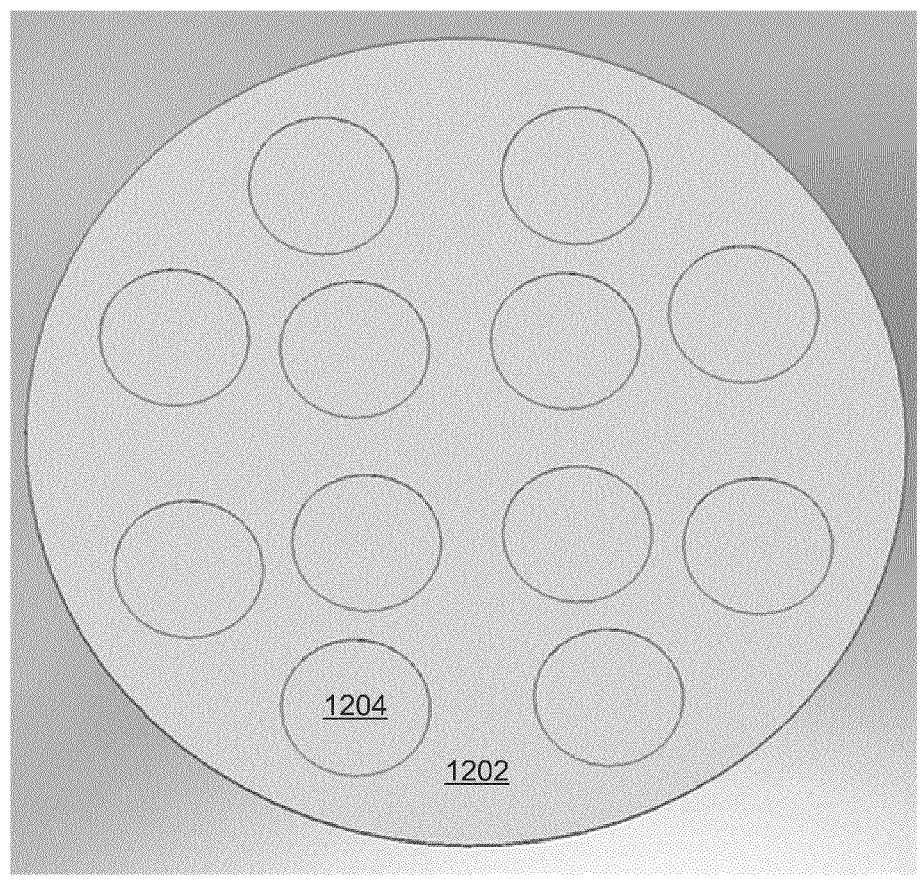
FIG. 12 illustrates a schematic diagram of a substrate that has been processed in a combinatorial manner.

Using a HPC PVD module as illustrated in FIG. 11 allows a substrate to be processed in a combinatorial manner wherein different parameters can be varied as discussed above. Examples of the parameters comprise process material composition, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. FIG. 12 illustrates one example of a pattern of site-isolated regions that can be processed using a HPC PVD module in accordance with some embodiments. In FIG. 12, the substrate is divided into twelve site-isolated regions 1204 on the substrate 1202. Therefore, in this example, twelve independent experiments could be performed on a single substrate. Those skilled in the art will understand that the twelve site-isolated regions illustrated in FIG. 12 are intended as an example and that any number of site-isolated regions could be formed. The substrate may then be processed through a next step that may be conventional or may also be a combinatorial step as discussed earlier with respect to FIG. 10.

Figure 13:
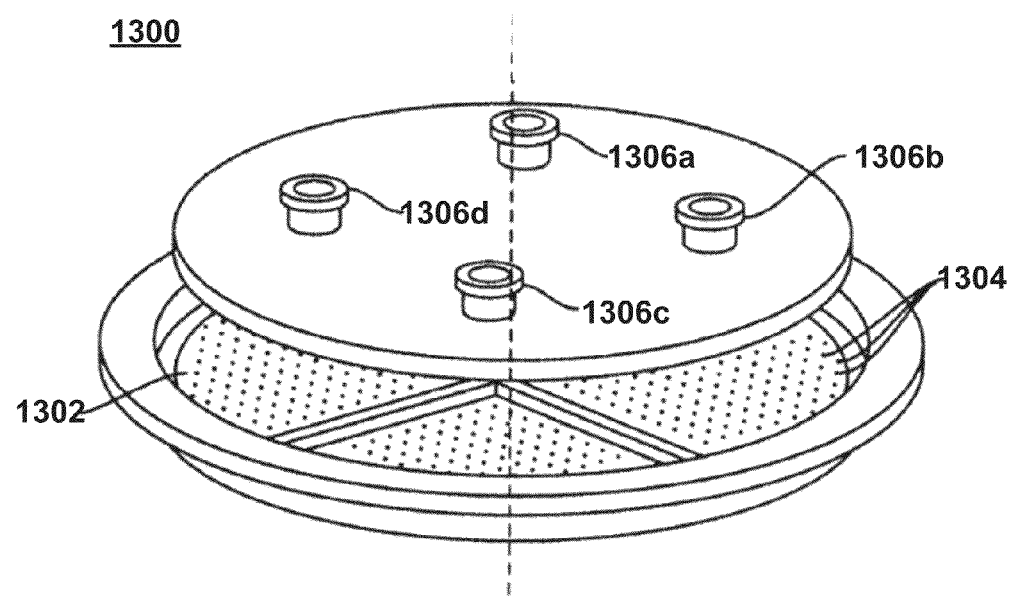
FIG. 13 illustrates a schematic diagram of a combinatorial ALD showerhead according to some embodiments described herein.

FIG. 13 illustrates an example of an ALD or CVD showerhead, 1300, used for combinatorial processing. Details of this type of showerhead and its use may be found in U.S. patent application Ser. No. 12/013,729 entitled "Vapor Based Combinatorial Processing" filed on Jan. 14, 2008 and claiming priority to Provisional Application No. 130/970,199 filed on Sep. 5, 2001, U.S. patent application Ser. No. 12/013,759 entitled "Vapor Based Combinatorial Processing" filed on Jan. 14, 2008 and claiming priority to Provisional Application No. 130/970,199 filed on Sep. 5, 2001, and U.S. patent application Ser. No. 12/205,578 entitled "Vapor Based Combinatorial Processing" filed on Sep. 5, 2008 which is a Continuation Application of the U.S. patent application Ser. No. 12/013,729 and claiming priority to Provisional Application No. 130/970,199 filed on Sep. 5, 2001, all of which are herein incorporated by reference.

The ALD or CVD showerhead 1300 illustrated in FIG. 13 comprises four quadrants 1302 used to deposit materials on a substrate. In this example, four quadrants or segments have been illustrated. Those skilled in the art will understand that the showerhead can be divided into any useful number of segments such as 2, 4, 6, 8, or 12 segments. As an example, in the case of a round substrate, four different materials and/or process conditions could be used to deposit materials in each of the four quadrants of the substrate (not shown). Precursor gases, reactant gases, purge gases, etc. are introduced into each of the four regions of the showerhead through gas inlet conduits 1306a-1306d. For simplicity, the four quadrants 1302 of showerhead 1300 have been illustrated as being a single chamber. Those skilled in the art will understand that each quadrant 1302 of showerhead 1300 may be designed to have two or more isolated gas distribution systems so that multiple reactive gases may be kept separated until they react at the substrate surface. Also for simplicity, on a single gas inlet conduit 1306a-1306d is illustrated for each of the four quadrants. Those skilled in the art will understand that each quadrant 1302 of showerhead 1300 may have multiple gas inlet conduits. The gases exit each quadrant 1302 of showerhead 1300 through holes 1304 in the bottom of the showerhead. The gases then travel to the substrate surface and react at the surface to deposit a material, etch an existing material on the surface, clean contaminants found on the surface, react with the surface to modify the surface in some way, etc. The showerhead illustrated in FIG. 13 is operable to be used with any of a CVD, PECVD, ALD, or PEALD technology.

Figure 14A:
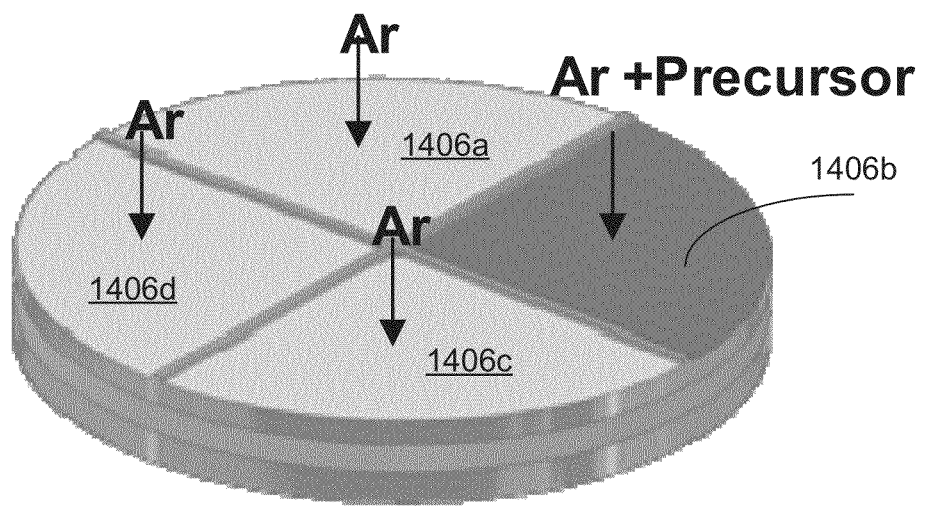
FIGS. 14A and 14B illustrate schematic diagrams of the use of a combinatorial ALD showerhead according to some embodiments described herein.
Figure 14B:
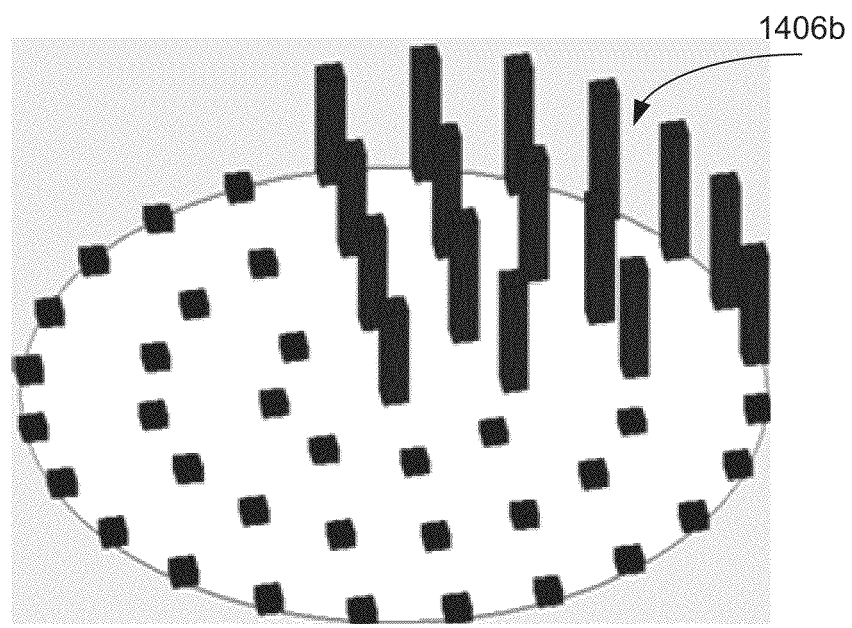

FIGS. 14A and 14B illustrate schematic diagrams of the use of a combinatorial ALD showerhead according to some embodiments described herein. In FIG. 14A, the four quadrants of the showerhead discussed with reference to FIG. 13 are illustrated, 1406a-1406d. As indicated, three of the quadrants (i.e. 1406a, 1406c, and 1406d) have only Ar flowing through them. Therefore, there would not be any deposition on the substrate under these three quadrants. As indicated, quadrant 1406b has Ar and one or more deposition precursors flowing through it. Therefore, a material would be deposited on the substrate under this quadrant. The process parameters can be varied among the four quadrants. Examples of the parameters comprise process material composition, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc. FIG. 14B illustrates the resulting thickness profile of the deposited material on the substrate using the showerhead configuration discussed with reference to FIG. 14A. The height of the bars corresponding to quadrant 1406b in FIG. 14A indicates that a film was deposited under this portion of the showerhead. Meanwhile, there is no discernable deposition in quadrants 1406a, 1406c, and 1406d. These figures illustrate how the segmented showerhead as discussed with reference to FIG. 6 can be used for combinatorial processing of regions of the substrate.

Figure 15:
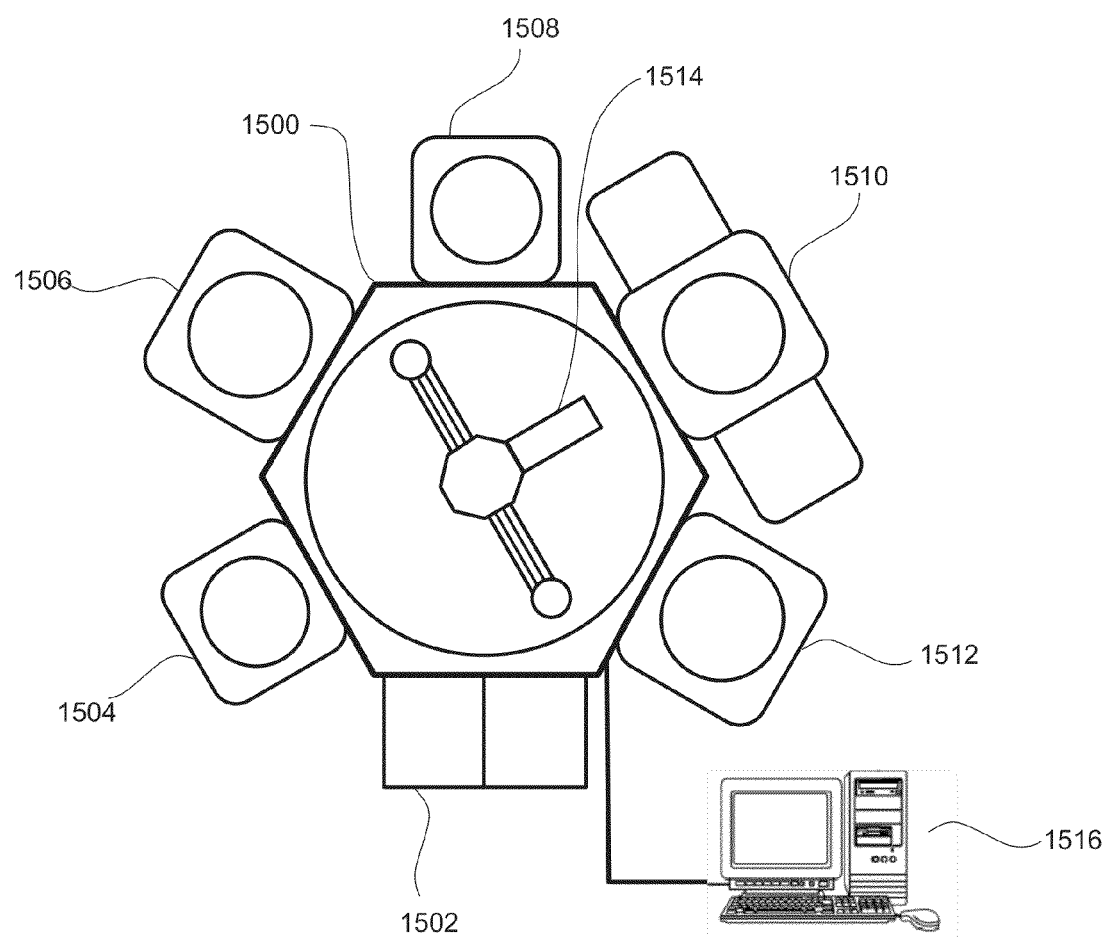
FIG. 15 illustrates a schematic diagram of a cluster system according to some embodiments described herein.

FIG. 15 is a simplified schematic diagram illustrating an integrated high productivity combinatorial (HPC) system in accordance with some embodiments of the invention. HPC system includes a frame 1500 supporting a plurality of processing modules. It should be appreciated that frame 1500 may be a unitary frame in accordance with some embodiments. In some embodiments, the environment within frame 1500 is controlled. Load lock/factory interface 1502 provides access into the plurality of modules of the HPC system. Robot 1514 provides for the movement of substrates (and masks) between the modules and for the movement into and out of the load lock 1502. Modules 1504-1512 may be any set of modules and preferably include one or more combinatorial modules. For example, module 1504 may be an orientation/degassing module, module 1506 may be a clean module, either plasma or non-plasma based, modules 1508 and/or 1510 may be combinatorial/conventional dual purpose modules. Module 1512 may provide conventional clean or degas as necessary for the experiment design. In some embodiments, the modules include one or more combinatorial PVD modules. In some embodiments, the modules include one or more combinatorial ALD modules.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 1516, may control the processes of the HPC system, including the power supplies and synchronization of the duty cycles described in more detail below. Further details of one possible HPC system are described in U.S. application Ser. Nos. 11/672,478 and 11/672,473. With HPC system, a plurality of methods may be employed to deposit material upon a substrate employing combinatorial processes.

Figure 16A:
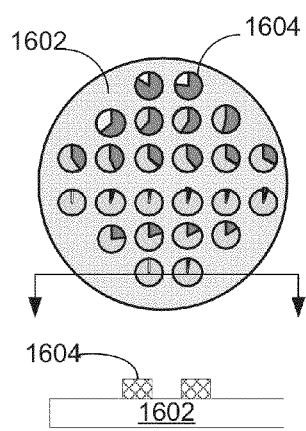
FIGS. 16A-16C are schematic diagrams illustrating various process sequences using combinatorial processing.
Figure 16B:
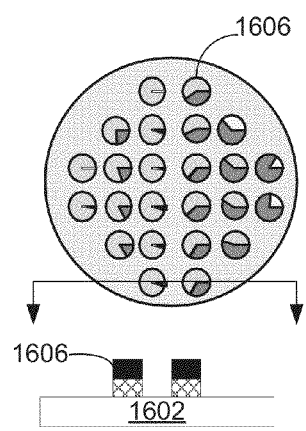
Figure 16C:
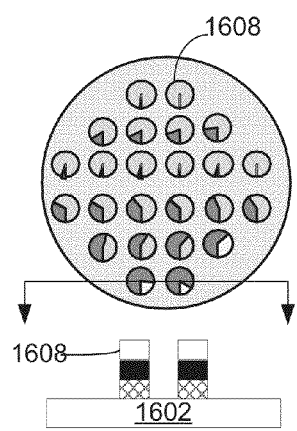

FIGS. 16A-16C are schematic diagrams illustrating various process sequences using combinatorial processing. Specifically, FIGS. 16A-16C are schematic diagrams illustrating the deposition of multilayer films using a HPC PVD module as discussed with respect to FIG. 11. In FIG. 16A, a first layer, 1604, is formed on a plurality of site-isolated regions defined on substrate, 1602. In FIGS. 16A-16C, twenty-four site-isolated regions are illustrated. However, as discussed previously, any useful number of site-isolated regions can be defined on the substrate. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like.

In FIG. 16B, a second layer 1606 is formed on the plurality of site-isolated regions defined on substrate 1602. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like. Those skilled in the art will understand that the combinations of the first layers 1604 and the second layers 1606 allow the interactions between the layers to be investigated across a wide range of process conditions.

In FIG. 16C, a third layer 1608 is formed on the plurality of site-isolated regions defined on substrate 1602. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like. Those skilled in the art will understand that the combinations of the first layers 1604, the second layers 1606, and the third layers 1608, allow the interactions between the layers to be investigated across a wide range of process conditions.

Figure 17A:
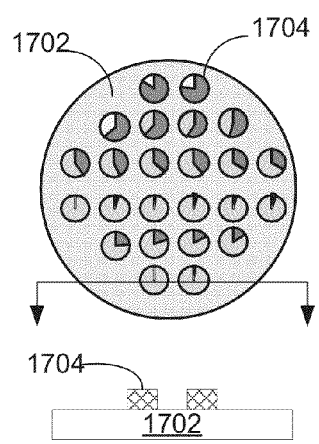
FIGS. 17A-17C are schematic diagrams illustrating various process sequences using combinatorial processing and evaluation.
Figure 17B:
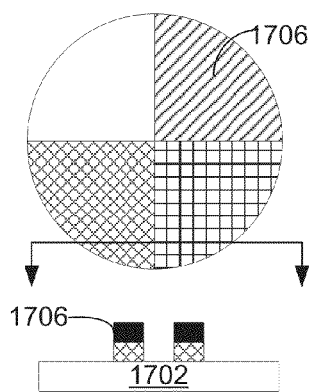
Figure 17C:
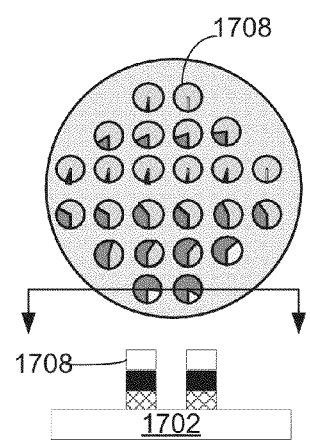

FIGS. 17A-17C are schematic diagrams illustrating various process sequences using combinatorial processing. Specifically, FIGS. 17A-17C are schematic diagrams illustrating the deposition of multilayer films using a combination of HPC PVD modules as discussed above, and HPC ALD modules as discussed above. In FIG. 17A, a first layer 1704 is formed on a plurality of site-isolated regions defined on substrate 1702 using a HPC PVD process as discussed previously. In FIGS. 17A and 17C, twenty-four site-isolated regions are illustrated. However, as discussed previously, any useful number of site-isolated regions can be defined on the substrate. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like.

In FIG. 17B, a second layer 1706 is formed on the plurality of site-isolated regions defined on substrate 1702 using a HPC ALD process as discussed previously. In FIG. 17B, four regions are illustrated. However, as discussed previously, any useful number of regions can be defined on the substrate. As illustrated by the different shading among the various regions, one or more process parameters can be varied among the regions in a combinatorial manner. For ALD deposition techniques, example of process parameters that can be varied include material composition, pressure, substrate temperature, precursor gas composition, precursor gas concentration, precursor gas pulse time, reactive gas composition, reactive gas concentration, reactive gas pulse time, gas flow rate, and the like. Those skilled in the art will understand that the combinations of the first layers 1704 and the second layers 1706 allow the interactions between the layers to be investigated across a wide range of process conditions.

In FIG. 17C, a third layer 1708 is formed on the plurality of site-isolated regions defined on substrate 1702. As illustrated by the different shading among the various site-isolated regions, one or more process parameters can be varied among the regions in a combinatorial manner. For PVD deposition techniques, example of process parameters that can be varied include material composition, power, pressure, substrate temperature, substrate bias, target-to-substrate distance, reactive gas concentration, gas flow rate, co-sputtering versus nanolaminate deposition, and the like. Those skilled in the art will understand that the combinations of the first layers 1704, the second layers 1706 and the third layers 1708 allow the interactions between the layers to be investigated across a wide range of process conditions.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:
1. An article comprising:
   a substrate;
   a reflective layer formed above the substrate,
      the reflective layer comprising silver; and
   a barrier layer formed above the reflective layer,
      the barrier layer comprising nickel, chromium, titanium, and aluminum, wherein a concentration of nickel in the barrier layer is between 5% by weight and 10% by weight, wherein a concentration of chromium in the barrier layer is between 25% by weight and 30% by weight, wherein a concentration of titanium in the barrier layer is between 30% by weight and 35% by weight, and wherein a concentration of aluminum in the barrier layer is between 30% by weight and 35% by weight, the barrier layer being configured to protect metallic silver in the reflective layer from oxidation during processing and operation of the article.

2. The article of claim 1, wherein the barrier layer further comprises oxygen.

3. The article of claim 1, wherein a weight ratio of titanium to aluminum is between 0.5 and 2.

4. The article of claim 1, wherein a weight ratio of titanium to aluminum is about 1.

5. The article of claim 1, wherein nickel, chromium, titanium, and aluminum are uniformly distributed throughout the barrier layer.

6. The article of claim 1, wherein the barrier layer consists essentially of nickel, chromium, titanium, and aluminum.

7. The article of claim 1, wherein the barrier layer has a thickness of between 1 Angstroms and 100 Angstroms.

8. The article of claim 1, wherein the barrier layer has a thickness of between 5 Angstroms and 30 Angstroms.

9. The article of claim 1, wherein the barrier layer has a thickness of between 10 Angstroms and 20 Angstroms.

10. The article of claim 1, wherein the barrier layer is deposited using physical vapor deposition.

11. The article of claim 1, wherein the barrier layer is formed using co-sputtering of nickel, chromium, titanium, and aluminum.

12. The article of claim 1, further comprising a seed layer formed between the substrate and the reflective layer, the seed layer directly contacting the reflective layer and comprising one of ZnO, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, or $MoO_3$ in a crystalline phase.

13. The article of claim 12, further comprising a dielectric layer formed between the seed layer and the substrate or formed over the barrier layer, the dielectric layer comprising one of $TiO_2$, $SnO_2$, or ZnSn.

14. The article of claim 13, wherein the dielectric layer comprises a dopant, the dopant comprising one of Al, Ga, In, Mg, Ca, Sr, Sb, Bi, Ti, V, Y, Zr, Nb, Hf, or Ta.

15. The article of claim 1, further comprising:
an additional reflective layer formed above the barrier layer,
the additional reflective layer comprising silver; and
an additional barrier layer formed above the additional reflective layer,
the additional barrier layer comprising nickel, chromium, titanium, and aluminum.

16. An article comprising:
a substrate;
a bottom diffusion layer formed above the substrate, the bottom diffusion layer comprising silicon nitride;
a bottom dielectric layer formed above the bottom diffusion layer, the bottom dielectric layer comprising one of $TiO_2$, $SnO_2$, or ZnSn and having a thickness of between 100 Angstroms and 300 Angstroms;
a seed layer formed above the bottom dielectric layer, the seed layer comprising one of ZnO, $SnO_2$, $Sc_2O_3$, $Y_2O_3$, $TiO_2$, $ZrO_2$, $HfO_2$, $V_2O_5$, $Nb_2O_5$, $Ta_2O_5$, $CrO_3$, $WO_3$, or $MoO_3$ in a crystalline phase and having a thickness of between 50 Angstroms and 200 Angstroms;
a reflective layer formed above and directly contacting the seed layer, the reflective layer comprising silver and having a thickness of between 50 Angstroms and 200 Angstroms;
a barrier layer formed above and directly contacting the reflective layer, the barrier layer comprising nickel, chromium, titanium, and aluminum, wherein a concentration of nickel in the barrier layer is between 5% by weight and 10% by weight, wherein a concentration of chromium in the barrier layer is between 25% by weight and 30% by weight, wherein a concentration of titanium in the barrier layer is between 30% by weight and 35% by weight, and wherein a concentration of aluminum in the barrier layer is between 30% by weight and 35% by weight, the barrier layer being configured to protect metallic silver of the reflective layer from oxidation during processing and operation of the article;
a top dielectric layer formed above the barrier layer, the top dielectric layer comprising one of $TiO_2$, $SnO_2$, or ZnSn and having a thickness of between 100 Angstroms and 300 Angstroms; and
a top diffusion layer formed above the top dielectric layer, the top diffusion layer comprising silicon nitride.

17. A method of forming an article, the method comprising:
providing a substrate;
forming a reflective layer over the substrate,
wherein forming the reflective layer comprises sputtering silver in a non-reactive environment; and
forming a barrier layer over the reflective layer, wherein the barrier layer comprises nickel, chromium, titanium and aluminum, a concentration of nickel in the barrier layer is between 5% by weight and 10% by weight, wherein a concentration of chromium in the barrier layer is between 25% by weight and 30% by weight, wherein a concentration of titanium in the barrier layer is between 30% by weight and 35% by weight, and wherein a concentration of aluminum in the barrier layer is between 30% by weight and 35% by weight,
wherein forming the barrier layer comprises co-sputtering nickel, chromium, titanium, and aluminum in a non-reactive environment; and
forming a dielectric layer over the barrier layer,
wherein forming the dielectric layer comprises sputtering titanium or tin in an oxygen containing environment, and wherein the barrier layer prevents oxygen in the oxygen containing environment from reaching and reacting with silver in the reflective layer.

* * * * *